(12) United States Patent
Nagaoka et al.

(10) Patent No.: US 8,729,773 B2
(45) Date of Patent: May 20, 2014

(54) DRIVE UNIT

(75) Inventors: Eiichi Nagaoka, Hyogo (JP); Hideaki Mukae, Hyogo (JP)

(73) Assignee: Panasonic Corporation, Osaka (JP)

( * ) Notice: Subject to any disclaimer, the term of this patent is extended or adjusted under 35 U.S.C. 154(b) by 373 days.

(21) Appl. No.: 13/196,992

(22) Filed: Aug. 3, 2011

(65) Prior Publication Data

US 2012/0031209 A1 Feb. 9, 2012

(30) Foreign Application Priority Data

Aug. 4, 2010 (JP) ................................. 2010-175021

(51) Int. Cl.
*F16H 27/02* (2006.01)

(52) U.S. Cl.
USPC ............. 310/323.02; 310/323.03; 310/323.16

(58) Field of Classification Search
USPC ........................... 310/323.02, 323.03, 323.16
See application file for complete search history.

(56) References Cited

U.S. PATENT DOCUMENTS

| | | | |
|---|---|---|---|
| 6,211,603 B1 | 4/2001 | Iino et al. | |
| 6,430,873 B1 * | 8/2002 | Borchuk et al. | 49/352 |
| 7,129,621 B2 * | 10/2006 | Sakano et al. | 310/323.09 |
| 7,242,131 B2 * | 7/2007 | Kishi et al. | 310/323.02 |
| 7,873,822 B2 * | 1/2011 | Kim et al. | 713/2 |
| 2006/0250048 A1 * | 11/2006 | Moteki et al. | 310/323.02 |
| 2008/0145042 A1 | 6/2008 | Kawai et al. | |
| 2008/0207390 A1 * | 8/2008 | Tochimoto et al. | 476/67 |
| 2010/0181870 A1 * | 7/2010 | Nagaoka et al. | 310/323.16 |
| 2011/0018394 A1 * | 1/2011 | Mukae | 310/323.02 |
| 2011/0227453 A1 * | 9/2011 | Araki et al. | 310/323.02 |
| 2011/0241487 A1 * | 10/2011 | Mukae et al. | 310/323.02 |

FOREIGN PATENT DOCUMENTS

| | | |
|---|---|---|
| JP | 10-327589 | 12/1998 |
| JP | 2008-172995 | 7/2008 |
| JP | 2008-245507 | 10/2008 |

* cited by examiner

*Primary Examiner* — Derek Rosenau
*Assistant Examiner* — Bryan Gordon
(74) *Attorney, Agent, or Firm* — Renner, Otto, Boisselle & Sklar, LLP

(57) ABSTRACT

A drive unit includes an actuator main body configured to vibrate to output a driving force, a movable body, which is contacted by the actuator main body and is movable relative to the actuator main body in a predetermined moving direction, and an opposing member positioned to face the actuator main body with the movable body interposed therebetween and hold the movable body together with the actuator main body so that the movable body is sandwiched therebetween. A portion of the movable body, which contacts the opposing member, has an elastic modulus lower than that of the opposing member.

4 Claims, 13 Drawing Sheets

DRIVE UNIT

CROSS-REFERENCE TO RELATED APPLICATION

This application claims priority to Japanese Patent Application No. 2010-175021 filed on Aug. 4, 2010, the disclosure of which including the specification, the drawings, and the claims are hereby incorporated by reference in its entirety. The disclosure of Japanese Patent Application No. 2011-136051 filed on Jun. 20, 2011, including the specification, the drawings and the claims are hereby incorporated by reference in its entirety.

BACKGROUND

A technique disclosed herein relates to drive units configured to drive a movable body using a vibratory actuator.

Conventionally, drive units employing a vibratory actuator have been known. For example, a drive unit according to Japanese Patent Publication No. 2008-172995 drives a movable body by vibrating a vibratory actuator comprised of a piezoelectric element. Specifically, the drive unit is configured so that the movable body is sandwiched between the vibratory actuator and an opposing member arranged at a position which is opposite to the vibratory actuator. The vibratory actuator and the opposing member are biased respectively in directions in which the vibratory actuator and the opposing member press the movable body. Thus, a friction force between the vibratory actuator and the movable body is increased. By vibrating the vibratory actuator in this state, driver elements are displaced according to the vibration of the vibratory actuator, whereby the movable body is driven.

In order to efficiently transmit the driving force of the vibratory actuator to the movable body, a biasing force of the vibratory actuator needs to be increased to increase the friction force between the vibratory actuator and the movable body. However, increasing the biasing force may deform the movable body. Therefore, in the drive unit according to Japanese Patent Publication No. 2008-172995, the rigidity of the movable body is increased. Specifically, members forming the movable body are made of, not a resin material or aluminum alloy, but ceramics or a stainless material having a higher rigidity than resin material or aluminum.

SUMMARY

In the above-described configuration, according to the movement of the movable body, portions of the movable body, which respectively contact the vibratory actuator and the opposing member, vary. For example, depending on a moving state of the movable body, the vibratory actuator and the opposing member might sandwich an end of the movable body therebetween. However, when the vibratory actuator and the opposing member sandwich the end portion of the movable body therebetween, the driving of the movable body becomes unstable. Therefore, the movable body can be moved only in a range where the vibratory actuator and the opposing member sandwich a portion (a middle portion) of the movable body other than the end therebetween. That is, a stroke of movement of the movable body is restricted, and is small.

The technique disclosed herein has been devised in the above-described points, and it is therefore an object of the present disclosure to expand the stroke of movement of the movable body, in which the movable body can be operated correctly.

As a result of intensive research, the present inventor found that instability of driving in the end portion of the movable body is caused by an unwanted force which acts on the movable body. The force which acts on the movable body will be described below.

The movable body is pressed by the vibratory actuator and the opposing member, and thus is deformed so that portions of the movable body, which contact the vibratory actuator and the opposing member, are deformed to be recessed. On the other hand, in a moving direction of the movable body, portions of the movable body located at both sides of each contact portion at a small distance from the contact portion are hardly deformed. That is, the movable body is recessed most at the contact portions, and a recess amount reduces as the distance from the contact portions increases in the moving direction. Thus, the movable body is deformed substantially symmetrically about each contact portion in the moving direction. At this time, pressing forces from the vibratory actuator and the opposing member do not act as forces to move the movable body in the moving direction.

However, the movable body is deformed in the above-described manner only when such a contact portion is positioned in the middle portion of the movable body. When the contact portion is positioned in the end portion of the movable body, the movable body is deformed in a different manner. Assume that a contact portion is positioned in the middle portion of the movable body. In this case, in the moving direction, there are parts which are hardly deformed at both sides of the contact portion. Since the movable body 11 is a continuum, which is a series of parts linked to each other, the linked parts restrict each other, and the amount of deformation reduces as the distance from the contact portion increases.

In contrast, when a contact portion is positioned in the end portion of the movable body, a part of the movable body 11 located closer to an end of the movable body than the contact portion in the moving direction is small. Therefore, only a small portion restricts deformation in the part of the movable body located closer to the end of the movable body than the contact portion, and the end portion of the movable body is easily deformed, as compared to the middle portion of the movable body. In other words, the end portion of the movable body has a lower rigidity than that of the middle portion thereof. However, there is a portion which is hardly deformed at the part closer to the center of the movable body than the contact portion in the moving direction, and therefore, the amount of deformation reduces as the distance from the contact portion increases in the same manner as when the contact portion is positioned in the middle portion of the movable body. In this manner, when the contact portion is positioned in the end portion of the movable body, the movable body is deformed substantially asymmetrically about the contact portion in the moving direction. Thus, the contact portion is not parallel to the moving direction, but is tilted down toward an end of the movable body. As a result, the pressing forces from the vibratory actuator and the opposing member act as forces to move the movable body in the moving direction, and the movable body might be ejected from between the vibratory actuator and the opposing member. A part of the pressing forces, which acts on the movable body as a force to move the movable body in the moving direction, is herein referred to as an "ejection force."

A drive unit disclosed herein can reduce the ejection force. Specifically, the drive unit includes an actuator main body configured to vibrate to output a driving force, a movable body which is contacted by the actuator main body and is movable relative to the actuator main body in a predetermined moving direction, and an opposing member positioned to face the actuator main body with the movable body interposed therebetween and configured to sandwich the movable body together with the actuator main body therebetween so that the movable body is kept movable, and a portion of the movable body, which contacts the opposing member, has an elastic modulus lower than that of the opposing member.

In the above drive unit, the portion of the movable body, which contacts the opposing member, has an elastic modulus lower than that of the opposing member. Therefore, when the movable body is deformed by a pressing force from the opposing member, the portion of the movable body, which is contacted by the opposing member, is locally deformed. Thus, a tilt of the contact portion can be reduced, and the ejection force can be reduced. As a result, a stroke of movement in which the movable body can be operated correctly can be expanded.

DETAILED DESCRIPTION

Example embodiments will be described below with reference to the drawings.

Figure 1:
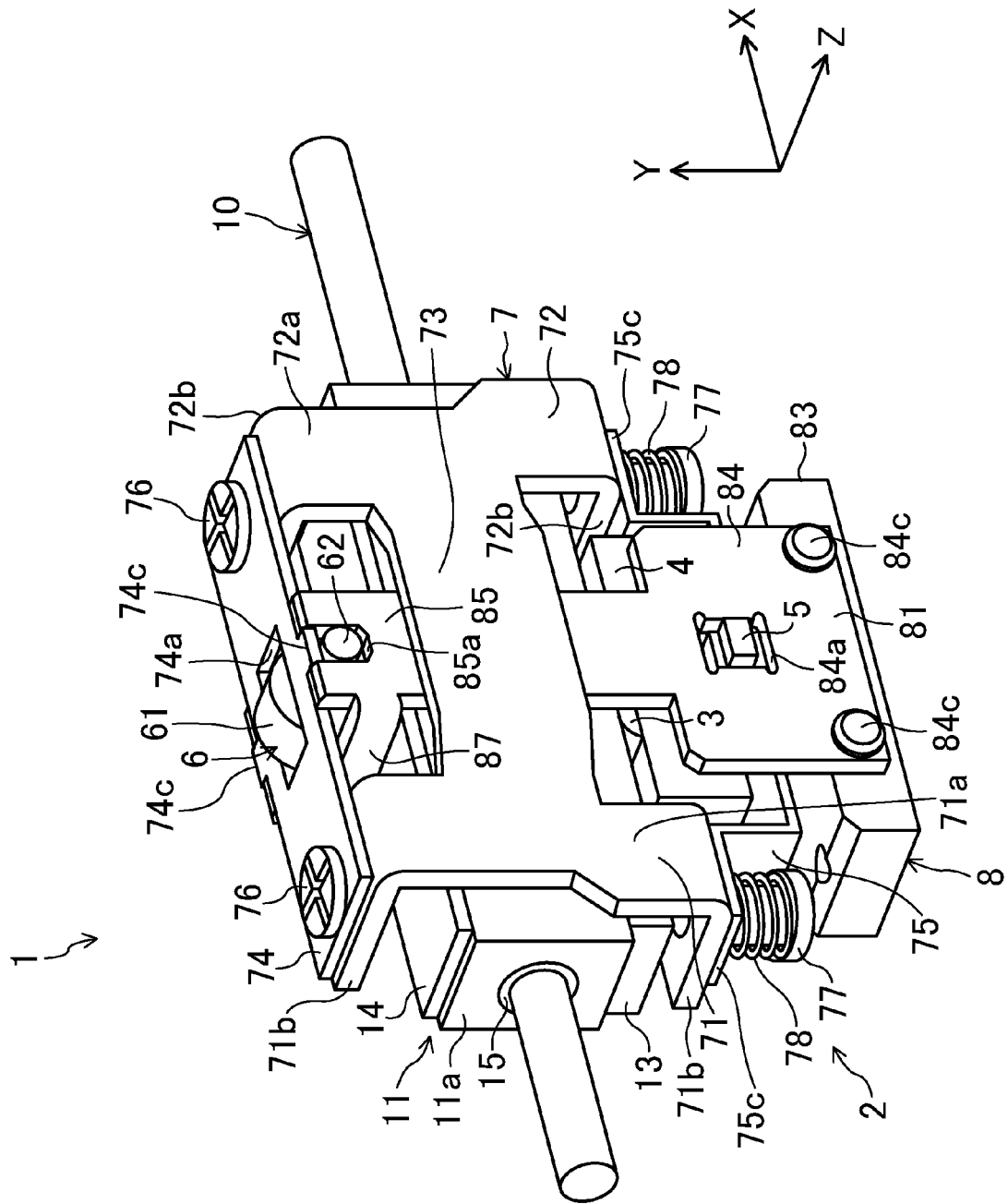
FIG. 1 is a perspective view of a drive unit according to an embodiment.
Figure 2:
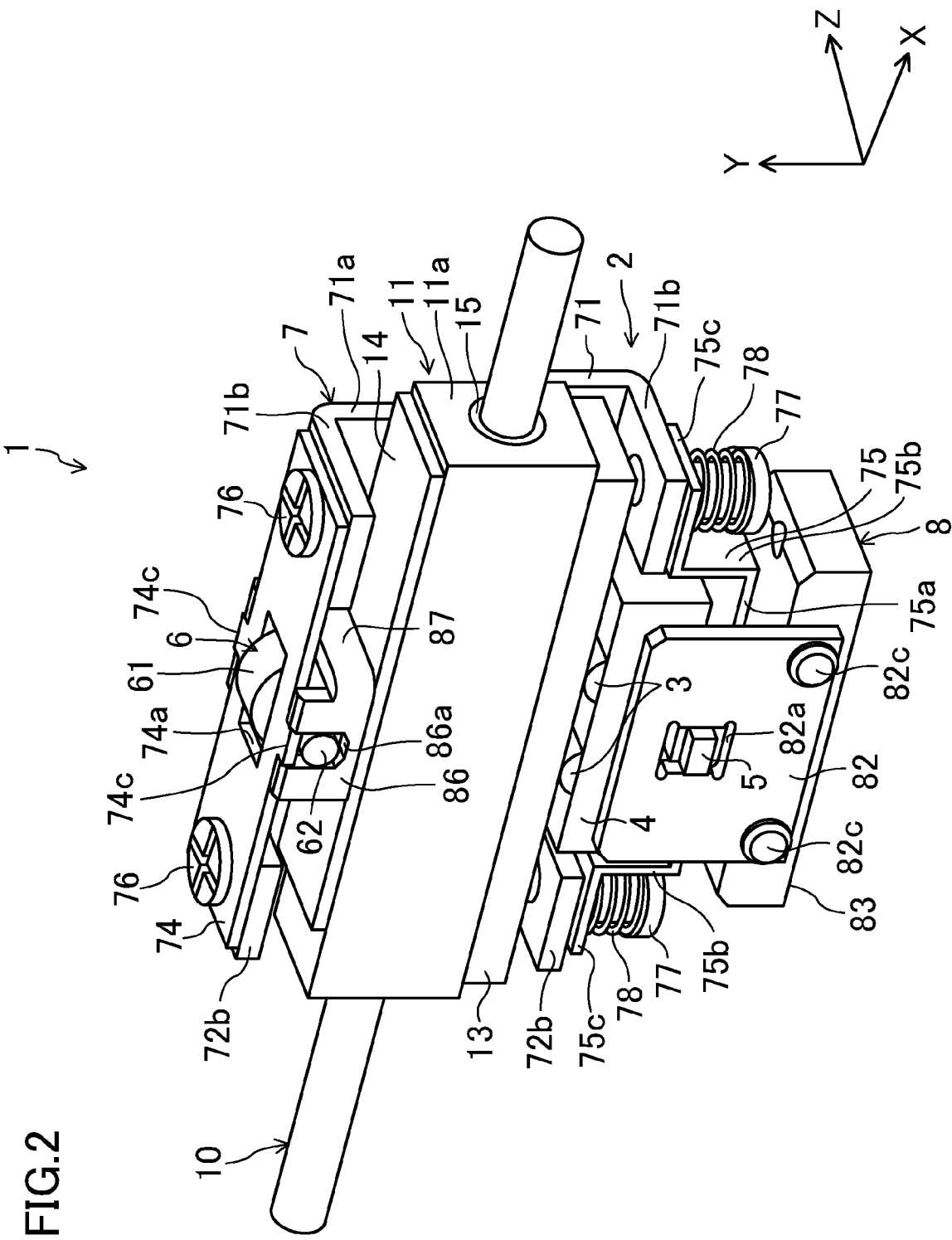
FIG. 2 is a perspective view of the drive unit as viewed from a different angle from FIG. 1.
Figure 3:
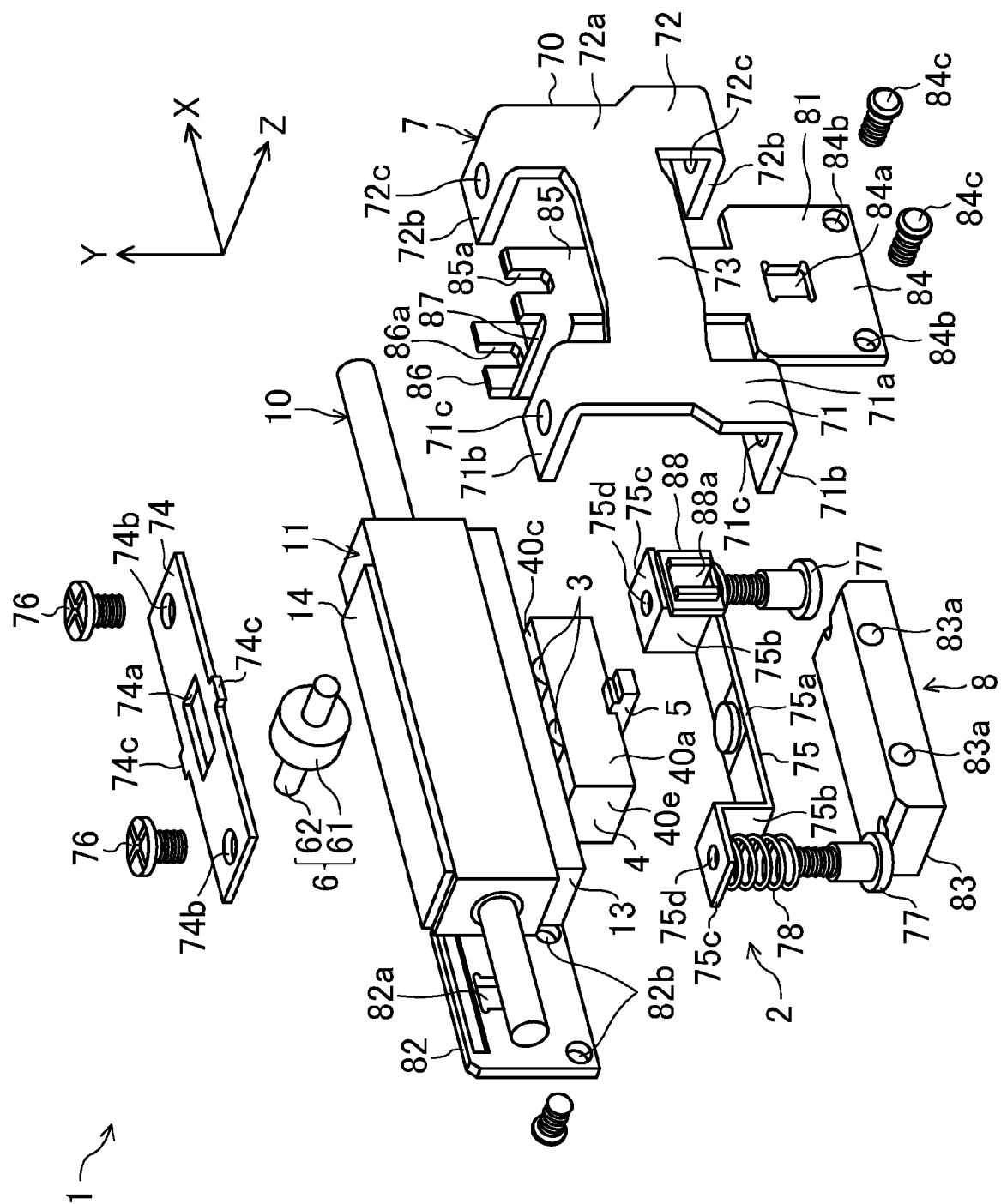
FIG. 3 is an exploded perspective view of the drive unit.

FIG. 1 is a perspective view of a drive unit according to an embodiment. FIG. 2 is a perspective view of the drive unit as viewed from a different angle from FIG. 1. FIG. 3 is an exploded perspective view of the drive unit. Note that in FIGS. 1, 2, and 3, the X axis corresponds to a moving direction in which a movable body 11 described later moves, the Y axis corresponds to a biasing direction in which an actuator main body 4 and a roller 6 described later are biased, and the Z axis corresponds to a direction which is perpendicular to both of the moving direction and the biasing direction. The same applies to FIGS. 10-14. As shown in FIGS. 1-3, a drive unit 1 of the embodiment includes: a shaft 10 fixed to a base (not shown); a movable body 11 slidably provided on the shaft 10; an ultrasonic actuator 2 configured to drive the movable body 11; a support body 8 fixed relative to the base, and configured to support the ultrasonic actuator 2; and a control unit (not shown) configured to perform drive control of the ultrasonic actuator 2.

The movable body 11 has a main body 11a being in the shape of a quadrangular prism and having a through hole 11b (shown only in FIG. 10) passing therethrough in the axial direction thereof, bearing portions 15 (only one of which is shown in FIGS. 1-3) provided at both ends of the through hole 11b, a first slide plate 13 that is contacted by an actuator main body 4 described later, and a second slide plate 14 that is contacted by a roller 6 described later. The bearing portions 15 are press-fitted in the through hole 11b, or are bonded and fixed to the through hole 11b. The shaft 10 is inserted through the bearing portions 15. Thus, the movable body 11 is slidable along the axial direction (the X-axis direction in the figure) of the shaft 10. The direction in which the shaft 10 extends is the movable direction of the movable body 11. As will be described in detail later, the movable body 11 receives a driving force generated by the ultrasonic actuator 2, and moves along the shaft 10 accordingly.

The main body 11a of the movable body 11 is made of, for example, polycarbonate containing glass fiber. Glass fiber is added to increase the rigidity of polycarbonate. Common polycarbonates containing glass fiber have a Young's modulus of 3.4 to 8.8 GPa. The bearing portions 15 are, for example, highly slidable oil retaining bearings. The bearing portions 15 are made, for example, by sintering. The bearing portions 15 have a Young's modulus of about 54 GPa. That is, the bearing portions 15 have a higher Young's modulus, namely a higher elastic modulus, than that of the main body 11a of the movable body 11.

The first slide plate 13 is made of, for example, alumina, and is bonded and fixed to one (the lower face in FIGS. 1-3) of the four side faces of the main body 11a of the movable body 11. Alumina has a Young's modulus of about 250 to 400 GPa. The rigidity of the first slide plate 13 is higher than that of the main body 11a. The first slide plate 13 has a thickness (a Y-axis direction dimension) equal to or larger than the double of the thickness of the second slide plate 14. Thus, the bending rigidity of the first slide plate 13 is increased to reduce deformation of the main body 11a of the movable body 11. The first slide plate 13 forms a sliding member.

The second slide plate 14 is made of, for example, a plastic material, and is bonded and fixed to another one of the four side faces of the main body 11a, which is opposite to the side face having the first slide plate 13 thereon. One of examples of the plastic material is polycarbonate which does not contain glass fiber. Polycarbonate has a Young's modulus of about 2.6 GPa. That is, the elastic modulus of the second slide plate 14 is lower than that of the main body 11a of the movable body 11. Also, the elastic modulus of the second slide plate 14 is lower than that of a roller 6 which will be described later.

Note that the materials of the first and second slide plates 13, 14 are not limited to the aforementioned materials, and any material may be used for each of the first and second slide plates 13, 14. However, the elastic modulus of the second slide plate 14 is preferably lower than that of the roller 6, and is more preferably lower than that of the main body 11a of the movable body 11.

The configuration of the ultrasonic actuator 2 will be described below. The ultrasonic actuator 2 includes: the actuator main body 4 configured to be biased so as to contact the movable body 11, and configured to vibrate to output a driving force to the movable body 11; a holder 5 configured to hold the actuator main body 4; the roller 6 configured to, together with the actuator main body 4, hold the movable body 11 therebetween; and a coupling member 7 configured to elastically couple the actuator main body 4 with the roller 6. The ultrasonic actuator 2 forms a vibratory actuator.

The actuator main body 4 is formed by a piezoelectric element. The actuator main body 4 is substantially in the shape of a rectangular parallelepiped having a pair of substantially rectangular principal faces 40a (only one of which is shown in FIG. 3) facing each other, a pair of longer side faces 40c (only one of which is shown in FIG. 3) facing each other, and a pair of shorter side faces 40e (only one of which is shown in FIG. 3) facing each other. The pair of longer side faces 40c are perpendicular to the principal faces 40a, and extend in the longitudinal direction of the principal faces 40a. The pair of shorter side faces 40e are perpendicular to both the principal faces 40a and the longer side faces 40c, and extend in the lateral direction of the principal faces 40a. The actuator main body 4 is provided with driver elements 3, 3 configured to transmit the driving force of the actuator main body 4 to the movable body 11.

Figure 4:
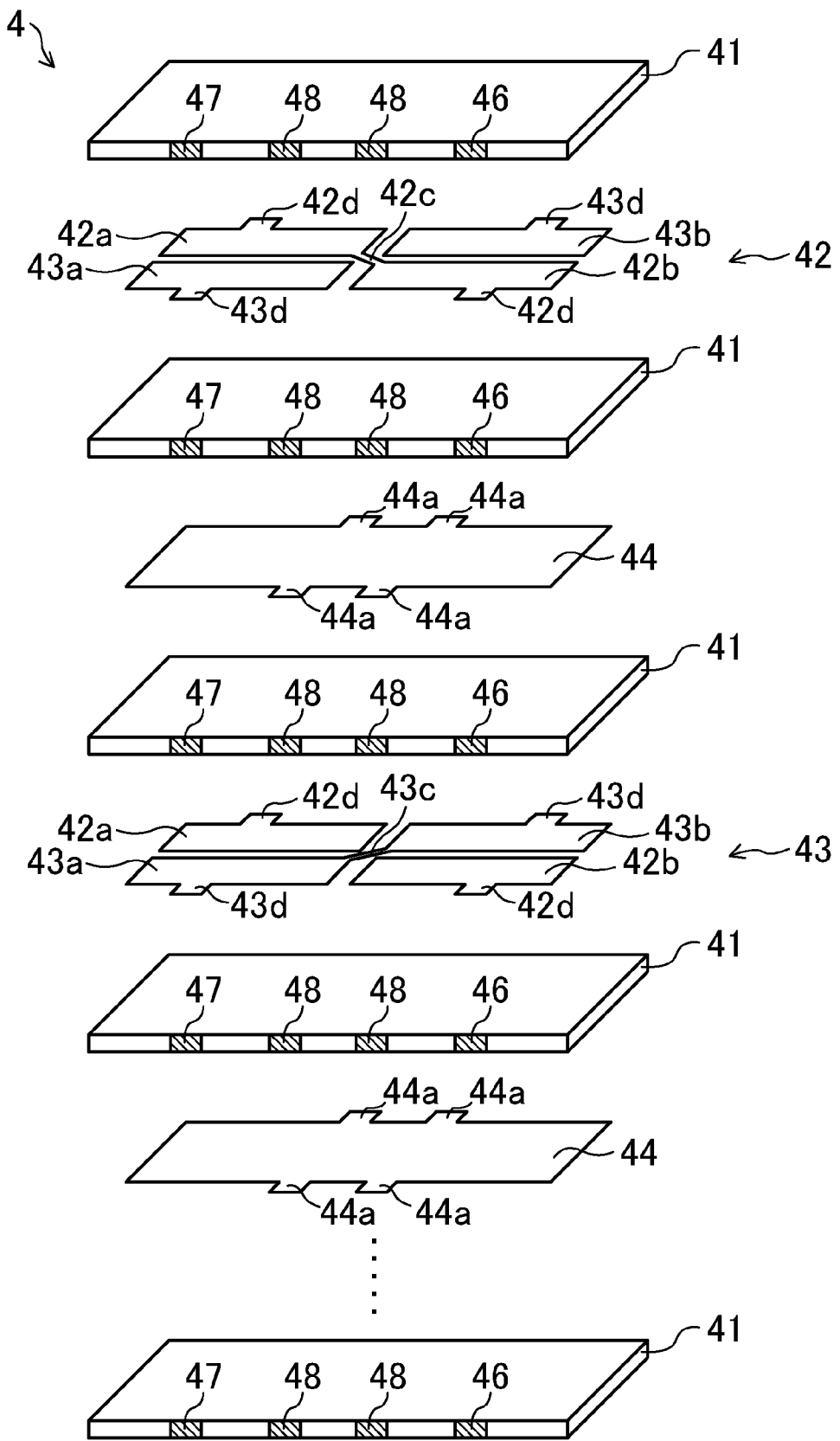
FIG. 4 is an exploded perspective view of a piezoelectric element unit.

FIG. 4 is an exploded perspective view of the actuator main body 4. As shown in FIG. 4, the actuator main body 4 is formed by alternately stacking piezoelectric element layers (piezoelectric elements) 41, 41, . . . and internal electrode layers 42, 44, 43, 44. The internal electrode layers 42, 44, 43, 44 include a first power-supply electrode layer 42, a common electrode layer 44, a second power-supply electrode layer 43, and another common electrode layer 44, which are arranged alternately with the piezoelectric element layers 41 in the stacking direction. A plurality of sets of the first power-supply electrode layer 42, the common electrode layer 44, the second power-supply electrode layer 43, and the common electrode layer 44, namely a plurality of sets of the internal electrode layers 42, 44, 43, 44, are repeatedly stacked together with each of the piezoelectric element layers 41 interposed between adjoining ones of the internal electrode layers 42, 44, 43, 44. Note that the piezoelectric element layers 41, 41 are located at both ends in the stacking direction. Each of the first power-supply electrode layer 42, the second power-supply electrode layer 43, and the common electrode layers 44 is printed on a principal face of a corresponding one of the piezoelectric element layers 41.

The piezoelectric element layers 41 are insulator layers made of, e.g., a ceramic material such as lead zirconate titanate. Like the actuator main body 4, each of the piezoelectric element layers 41 is substantially in the shape of a rectangular parallelepiped having a pair of principal faces, a pair of longer side faces, and a pair of shorter side faces. Each of the piezoelectric element layers 41 has first and second external electrodes 46, 47 and two common external electrodes 48, 48 on each of the longer side faces. The first and second external electrodes 46, 47 are formed at both longitudinal ends of each longer side face of each piezoelectric element layer 41, and the two common external electrodes 48, 48 are formed at positions located inside the first and second external electrodes 46, 47 in the longitudinal direction. That is, on each longer side face of each piezoelectric element layer 41, the first external electrode 46, the common external electrode 48, the common external electrode 48, and the second external electrode 47 are sequentially arranged in this order in the longitudinal direction so as to be separated from each other.

Each of the common electrode layers 44 has a substantially rectangular shape, and is provided over substantially the entire principal faces of the piezoelectric element layers 41. Each of the common electrode layers 44 has extraction electrodes 44a, 44a extending from each of the longer side portions of the common electrode layer 44 to the common external electrodes 48, 48 formed on the longer side faces of the piezoelectric element layers 41.

Figure 5:
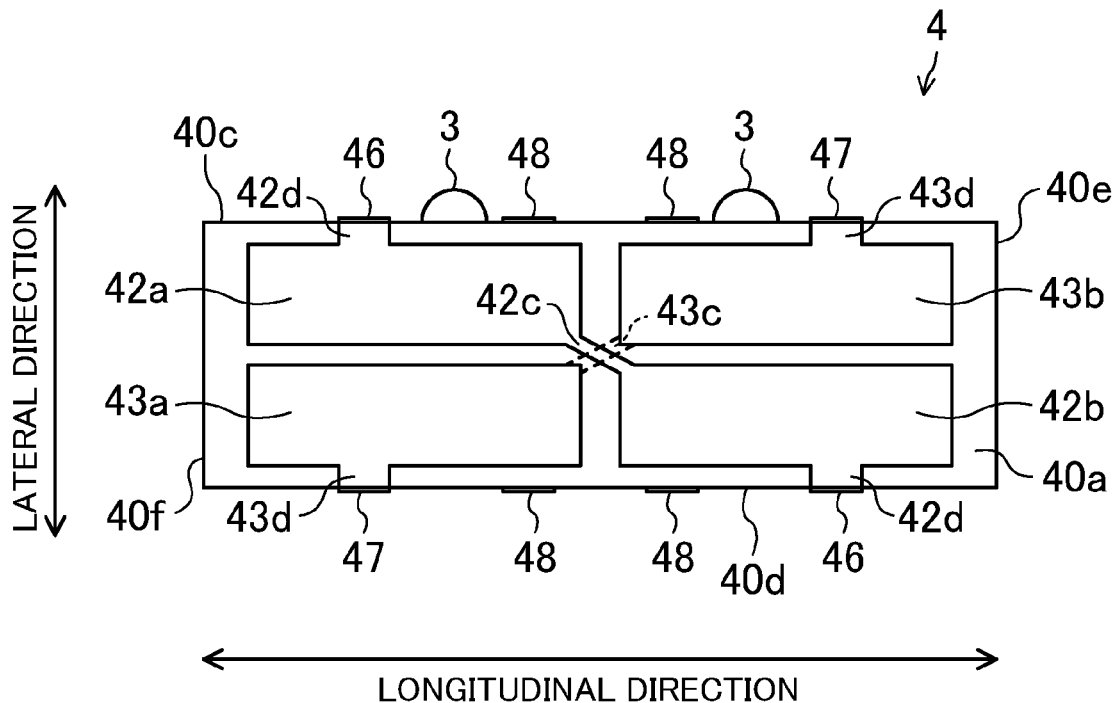
FIG. 5 is a schematic front view showing a schematic configuration of an actuator main body.

As shown in FIG. 5, each of the first and second power-supply electrode layers 42, 43 has a pair of first electrodes 42a, 42b and a pair of second electrodes 43a, 43b. Of four regions of the principal face of each piezoelectric element layer 41 defined by dividing the principal face in half both in the longitudinal and lateral directions, the pair of first electrodes 42a, 42b are formed in one of two pairs of diagonally opposite regions of the principal face, and the pair of second electrodes 43a, 43b are formed in the other pair of diagonally opposite regions. The first electrodes 42a, 42b and the second electrodes 43a, 43b face the common electrode layers 44 with a corresponding one of the piezoelectric element layers 41 interposed therebetween. Extraction electrodes 42d, 42d are formed so as to extend from the first electrodes 42a, 42b to the first external electrodes 46, 46 formed on the longer side faces of the piezoelectric element layers 41 and adjoining the first electrodes 42a, 42a. Extraction electrodes 43d, 43d are formed so as to extend from the second electrodes 43a, 43b to the second external electrodes 47, 47 formed on the longer side faces of the piezoelectric element layers 41 and adjoining the second electrodes 43a, 43a. In the first power-supply electrode layer 42, the first electrodes 42a, 42b are electrically connected together via a first conductive electrode 42c. In the second power-supply electrode layer 43, the second electrodes 43a, 43b are electrically connected together via a second conductive electrode 43c.

In the actuator main body 4 formed by alternately stacking the piezoelectric element layers 41, 41, . . . and the internal electrode layers 42, 44, 43, 44, the common external electrodes 48, 48 of the piezoelectric element layers 41 are aligned in the stacking direction in each of the longer side faces 40c, 40d to form single external electrodes 48. The extraction electrodes 44a, 44a of the common electrode layers 44, 44 are electrically connected to the external electrodes 48. Thus, the common electrode layers 44, 44, . . . provided on the different piezoelectric element layers 41, 41, . . . are electrically connected together via the common external electrodes 48, 48.

Similarly, in the actuator main body 4, the first external electrodes 46 of the piezoelectric element layers 41 are aligned in the stacking direction on each of the longer side faces 40c, 40d to form single first external electrodes 46. The second external electrodes 47 of the piezoelectric element layers 41 are also aligned in the stacking direction on each of the longer side faces 40c, 40d to form single second external electrodes 47. The extraction electrodes 42d, 42d from the first electrodes 42a, 42b are electrically connected to the first external electrodes 46, 46. The extraction electrodes 43d, 43d from the second electrodes 43a, 43b are electrically connected to the second external electrodes 47, 47. Thus, the first electrodes 42a, 42b are electrically connected to the first electrodes 42a, 42b provided on the different piezoelectric element layers 41, 41, . . . via the first conductive electrodes 42c and the first external electrodes 46, 46. The second electrodes 43a, 43b are electrically connected to the second electrodes 43a, 43b provided on the different piezoelectric element layers 41, 41, . . . via the second conductive electrodes 43c and the second external electrodes 47, 47. Signal lines from the control unit are connected to the external electrodes 46, 47, 48. The actuator main body 4 is supplied with power via the external electrodes 46, 47, 48.

The two driver elements 3, 3 are provided on one longer side face 40c (that is, one of the pair of faces facing the vibration direction of bending vibration described later; hereinafter also referred to as the "installation face") of the actuator main body 4.

The driver elements 3, 3 are columnar members with a semicircular cross section, and are made of zirconia, alumina, silicon nitride, silicon carbide, tungsten carbide, etc. The driver elements 3, 3 are arranged so that their axes extend along the thickness direction of the actuator main body 4. The driver elements 3, 3 are bonded to the installation face 40c via an adhesive so as to be in surface contact therewith.

The driver elements 3, 3 provided on the installation face 40c are located at a distance of 30-35% of the entire length of the installation face 40c inward from both longitudinal ends of the actuator main body 4. That is, the positions of the driver elements 3, 3 correspond to antinodes of a second-order mode of bending vibration, described later, of the actuator main body 4, and correspond to the points of maximum vibration.

In the actuator main body 4 thus configured, the external electrodes 48 are connected to the ground, and alternating current (AC) voltages having a predetermined frequency and having a phase difference of 90° therebetween are applied to the first and second external electrodes 46, 47. Thus, the AC voltages having a phase difference of 90° therebetween are applied to the first electrodes 42a, 42b located in one of the pairs of diagonally opposite regions of the principal face of the piezoelectric element layer 41, and to the second electrodes 43a, 43b located in the other pair of diagonally opposite regions, thereby inducing in the actuator main body 4 stretching vibration in the longitudinal direction thereof (so-called "longitudinal vibration") and bending vibration in the lateral direction thereof (so-called "lateral vibration").

Figure 6:
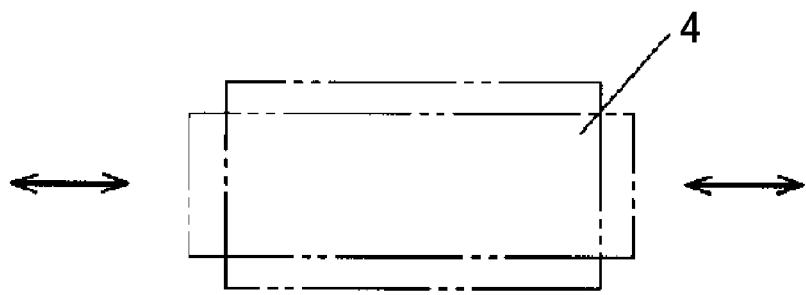
FIG. 6 is a conceptual diagram showing displacement of the actuator main body caused by a first-order mode of longitudinal vibration in the longitudinal direction.
Figure 7:
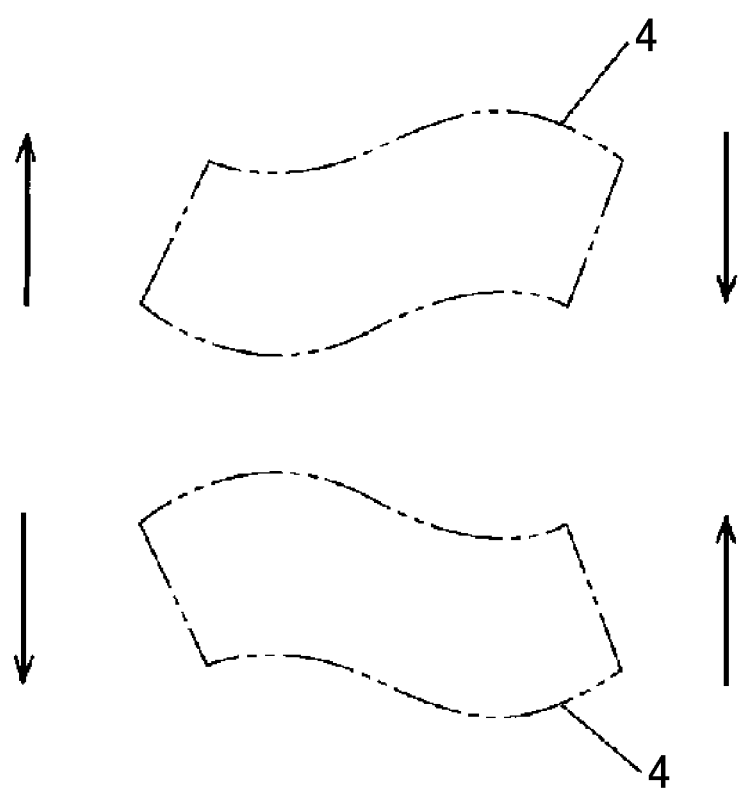
FIG. 7 is a conceptual diagram showing displacement of the actuator main body caused by a second-order mode of bending vibration.
Figure 8A:
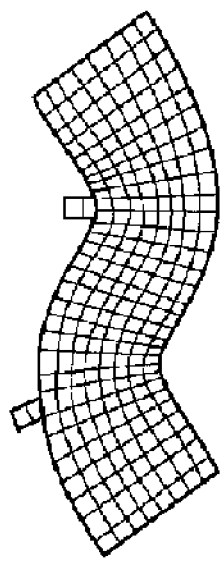
FIGS. 8A-8D are conceptual diagrams showing operation of the actuator main body
Figure 8B:
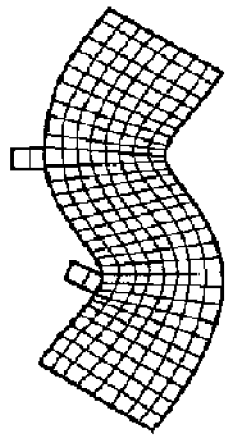
Figure 8C:
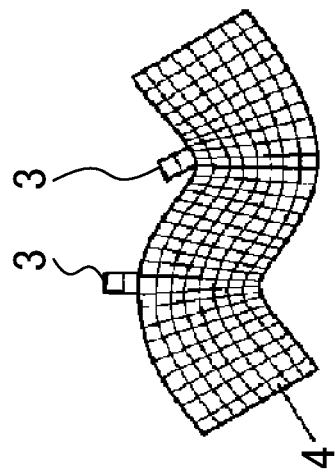
Figure 8D:
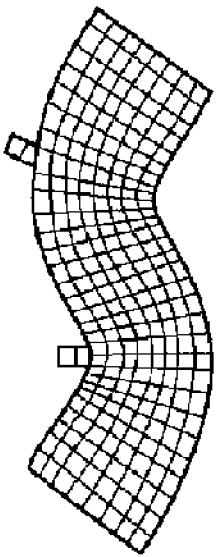

The resonant frequency of stretching vibration and the resonant frequency of bending vibration are determined by the material, shape, etc. of the actuator main body 4. These resonant frequencies are also affected by the force supporting the actuator main body 4, and the supported portions of the actuator main body 4. In view of the above, these resonant frequencies are made substantially equal to each other, and AC voltages having a frequency close to this resonant frequency and having a phase difference of 90° therebetween are applied to the first and second external electrodes 46, 47. For example, the shape, etc. of the actuator main body 4 are designed so that the first-order mode of stretching vibration (see FIG. 6) has the same resonant frequency as that of the second-order mode of bending vibration (see FIG. 7), and the AC voltages having a frequency close to this resonant frequency and having a phase difference of 90° therebetween are applied as described above. This harmonically induces the first-order mode of stretching vibration and the second-order mode of bending vibration in the actuator main body 4, whereby the shape of the actuator main body 4 changes sequentially as shown in FIGS. 8A-8D.

As a result, the driver elements 3 provided on the actuator main body 4 move in a substantially elliptical path, that is, in an orbital path, in a plane parallel to the principal faces of the actuator main body 4 (a plane parallel to the plane of the paper of FIG. 7), namely in a plane including the longitudinal and lateral directions (i.e., a plane including the vibration directions of stretching vibration and bending vibration).

The actuator main body 4 thus configured is placed so that the driver elements 3, 3 contact the first slide plate 13 of the movable body 11.

The holder 5 is a member in the shape of a quadrangular prism, which is made of a polycarbonate (containing glass fiber). The holder 5 is provided on the longer side face of the actuator main body 4 having no driver elements 3, 3 thereon. The holder 5 is attached to this longer side face of the actuator main body 4 so as to extend in the thickness direction (i.e., the stacking direction) of the actuator main body 4 at the longitudinal center of the actuator main body 4. Both ends of the holder 5 protrude beyond both principal faces of the actuator main body 4 in the thickness direction.

The roller 6 has a roller main body 61 and a roller shaft 62. The roller main body 61 is rotatably attached to the roller shaft 62 via a ball bearing. The roller 6 forms an opposing member. The roller 6 contacts the movable body 11, and is positioned so as to face the actuator main body 4 with the movable body 11 interposed therebetween. The roller main body 61 and the roller shaft 62 are made of stainless alloy such as SUS304 and SUS410 in order to increase their rigidity. The Young's modulus of stainless alloy is about 200 GPa.

The coupling member 7 has a coupling member main body 70, a pressing plate 74 attached to the coupling member main body 70 to press the roller 6 against the movable body 11, and a plate spring 75 attached to the coupling member main body 70 to press the actuator main body 4 against the movable body 11. The coupling member 7 couples the actuator main body 4 with the roller 6, and biases the actuator main body 4 and the roller 6 so that the actuator main body 4 and the roller 6 press the movable body 11.

The coupling member main body 70 has first and second coupling portions 71, 72 extending parallel to each other in the lateral direction of the actuator main body 4, and a third coupling portion 73 extending in the longitudinal direction of the actuator main body 4 to couple the first and second coupling portions 71, 72 together.

The first coupling portion 71 has a flat main body portion 71a extending in the lateral direction of the actuator main body 4, and attachment portions 71b, 71b that are bent substantially perpendicularly to the main body portion 71a from both ends of the main body portion 71a. The second coupling portion 72 has a shape similar to that of the first coupling portion 71, and has a main body portion 72a and attachment portions 72b, 72b. The attachment portions 71b, 72b have tapped holes 71c, 72c (shown only in FIG. 3) passing therethrough. One of the attachment portions 71b, 71b of the first coupling portion 71 and one of the attachment portions 72b, 72b of the second coupling portion 72 face the second slide plate 14 of the movable body 11, and the other attachment portion 71b of the first coupling portion 71 and the other attachment portion 72b of the second coupling portion 72 face the first slide plate 13 of the movable body 11. The third coupling portion 73 couples the main body portion 71a of the first coupling portion 71 with the main body portion 72a of the second coupling portion 72. The third coupling portion 73 does not extend on the same plane as the main body portion 71a of the first coupling portion 71 and the main body portion 72a of the second coupling portion 72, but protrudes beyond the main body portions 71a, 72a to the side opposite to the attachment portions 71b, 72b. The first to third coupling portions 71-73 are formed as an integral part by bending a flat plate, and have an overall "H" shape.

The pressing plate 74 is formed by a substantially rectangular flat plate. The pressing plate 74 has a rectangular through hole 74a formed in the longitudinal center thereof, and has circular insertion holes 74b, 74b (shown only in FIG. 3) formed at both longitudinal ends thereof so as to pass therethrough. The pressing plate 74 is screwed on those attachment portions 71b, 72b of the first and second coupling portions 71, 72 which face the second slide plate 14. Specifically, screws 76, 76 inserted through the insertion holes 74b, 74b of the pressing plate 74 are tightened into the tapped hole 71c of the attachment portion 71b and the tapped hole 72c of the attachment portion 72b to attach the pressing plate 74 to the first and second coupling portions 71, 72. Note that the pressing plate 74 may be formed integrally with the first and second coupling portions 71, 72.

At this time, the roller 6 is held between the pressing plate 74 and the movable body 11. Specifically, the roller main body 61 is located in the through hole 74a of the pressing plate 74, and protrudes beyond the through hole 74a. At this time, the roller shaft 62 of the roller 6 contacts the pressing plate 74, and is pressed toward the movable body 11 by the pressing plate 74. Thus, the roller main body 61 is pressed against the second slide plate 14 of the movable body 11. Note that protrusions 74c, 74c protruding in the lateral direction of the pressing plate 74 are provided at the longitudinal centers of the longer sides of the pressing plate 74.

The plate spring 75 is formed by bending a sheet metal. Specifically, the plate spring 75 has a bottom plate portion 75a extending parallel to the longer side faces of the actuator main body 4, standing plate portions 75b, 75b standing from both ends of the bottom plate portion 75a and extending parallel to the shorter side faces of the actuator main body 4, and flange portions 75c, 75c extending outward from the tip ends of the standing plate portions 75b, 75b and parallel to the bottom plate portion 75a. The plate spring 75 has an overall "U" shape so as to cover from the outside the longer side face of the actuator main body 4 having the holder 5 thereon, and the two shorter side faces thereof. Each flange portion 75c has an insertion hole 75d passing therethrough, and configured to receive therethrough a screw described later.

The plate spring 75 is screwed on those attachment portions 71b, 72b of the first and second coupling portions 71, 72 which face the first slide plate 13. Specifically, shoulder screws 77, 77 inserted through the insertion holes 75d, 75d of the plate spring 75 are tightened into the tapped hole 71c of the attachment portion 71b and the tapped hole 72c of the attachment portion 72b to attach the plate spring 75 to the first and second coupling portions 71, 72. At this time, coil springs 78 are fitted on the shoulder screws 77. Each of the coil springs 78 is held between the head of the shoulder screw 77 and the plate spring 75, and is compressively deformed. The actuator main body 4 is contained and held between the plate spring 75 thus attached to the coupling member 7 and the movable body 11. Specifically, the bottom plate portion 75a of the plate spring 75 contacts the holder 5 provided on the actuator main body 4. Thus, the elastic force of the compressively deformed coil springs 78 biases the actuator main body 4 toward the movable body 11 via the plate spring 75 and the holder 5, whereby the actuator main body 4 presses the first slide plate 13 of the movable body 11. That is, the plate spring 75, the shoulder screws 77, and the coil springs 78 function as a biasing portion.

In addition, the elastic force of the coil springs 78 is also transmitted to the coupling member 7 via the shoulder screws 77, and further to the roller 6 via the coupling member 7 and the pressing plate 74. That is, the elastic force of the coil springs 78 biases the roller 6 toward the movable body 11, whereby the roller 6 presses the second slide plate 14 of the movable body 11.

Thus, in the ultrasonic actuator 2, the actuator main body 4 and the roller 6, which are coupled together by the coupling member 7, press the movable body 11 while holding the movable body 11 therebetween. Thus, a frictional force according to the elastic force of the coil springs 78 is generated between the driver elements 3, 3 of the actuator main body 4 and the movable body 11, whereby a driving force that is output from the driver elements 3, 3 can be efficiently transmitted to the movable body 11. Although the driver elements 3, 3 are pressed against the movable body 11 in this configuration, the movable body 11 is also pressed from the side opposite to the driver elements 3, 3 by the roller 6 with a pressing force approximately equal to that of the driver elements 3, 3. Thus, these pressing forces applied to the movable body 11 cancel each other. This can reduce an unwanted force unevenly applied to the shaft 10, whereby the movable body 11 can be smoothly moved.

The configuration of the support body 8 will be described below. The support body 8 has first and second support plates 81, 82 configured to support the actuator main body 4, and a base member 83 to which the first and second support plates 81, 82 are attached and which is fixed to the base. The support body 8 forms a support portion.

The base member 83 is a block-shaped member, and is screwed to the base. The base member 83 has tapped holes 83a, 83a (only two of which are shown in FIG. 3) for attaching the first and second support plates 81, 82 to the base member 83.

The first support plate 81 is formed by a bent plate-like member. The first support plate 81 has a rectangular base end portion 84, an extended portion 85 extending from the base end portion 84, an opposing guide portion 86 provided so as to face the tip end of the extended portion 85, and a coupling portion 87 coupling the extended portion 85 with the opposing guide portion 86.

An opening 84a is formed in the center of the base end portion 84 so as to pass therethrough in the thickness direction. A guide member 88 (only one is shown in FIG. 3) configured to support the holder 5 is provided at the opening 84a. The guide member 88 is bonded and fixed to the base end portion 84. The guide member 88 has a guide hole 88a in the form of a long hole. The guide hole 88a passes through the guide member 88, and extends in the direction in which the actuator main body 4 is biased toward the movable body 11 (that is, the lateral direction of the actuator main body 4, the Y-axis direction in the figure). The width of the guide hole 88a is slightly greater than that of the holder 5. An end portion of the holder 5, which protrudes beyond the actuator main body 4 in the thickness direction thereof, is inserted through the guide hole 88a. The end portion of the holder 5 is slidable in the guide hole 88a in the direction in which the guide hole 88a extends. The guide member 88 is made of a material having a lower elastic modulus and lower hardness than those of the base end portion 84. Moreover, the guide member 88 is made of a material that is softer than the holder 5 and is highly slidable on a resin material, etc. For example, the guide member 88 is made of polyacetal. Note that the guide hole 88*a* may be a bottomed hole rather than a through hole passing through the guide member 88, depending on the amount by which the holder 5 protrudes beyond the actuator main body 4. The base end portion 84 has insertion holes 84*b* passing therethrough. The insertion holes 84*b* are formed at two of the four corners of the base end portion 84, which are located at both ends of the side opposite to the side having the extended portion 85. The first support plate 81 is attached to the base member 83 by inserting screws 84*c*, 84*c* through the insertion holes 84*b*, 84*b*, and tightening the screws 84*c*, 84*c* into the tapped holes 83*a*, 83*a* of the base member 83.

The extended portion 85 extends from one side of the base end portion 84 in the same direction as that in which the guide hole 88*a* extends. A cutout as a guide groove 85*a* is formed at the tip end of the extended portion 85. That is, the extended portion 85 has a bifurcated or "U"-shaped tip end. The direction in which the guide groove 85*a* extends corresponds with the direction in which the guide hole 88*a* of the base end portion 84 extends. That is, the guide groove 85*a* and the guide hole 88*a* are aligned in a line.

Like the tip end portion of the extended portion 85, a cutout as a guide groove 86*a* is formed in the opposing guide portion 86, and thus the opposing guide portion 86 is formed as a bifurcated or "U"-shaped portion. The opposing guide portion 86 is coupled with the tip end portion of the extended portion 85 via the coupling portion 87 so as to face the tip end portion of the extended portion 85.

The guide grooves 85*a*, 86*a* have a width slightly greater than the outer diameter of the roller shaft 62 of the roller 6 so that the roller shaft 62 fits therein. The guide grooves 85*a*, 86*a* are configured so that not only the roller shaft 62 but also the protrusions 74*c*, 74*c* of the pressing plate 74 fit therein.

The second support plate 82 is formed by a substantially rectangular flat plate-like member. An opening 82*a* is formed substantially in the center of the second support plate 82 so as to pass through the second support plate 82 in the thickness direction. A guide member (not shown) configured to support the holder 5 is provided in the opening 82*a*. The guide member has the same configuration as that of the guide member 88 of the first support plate 81. That is, the guide member has a guide hole in the form of a long hole. The guide hole passes through the guide member, and extends in the direction in which the actuator main body 4 is biased toward the movable body 11. An end portion of the holder 5, which protrudes beyond the actuator main body 4 in the thickness direction thereof, is inserted through the guide hole. The guide hole has a width slightly greater than that of the holder 5. The end portion of the holder 5 is slidable in the guide hole in the direction in which the guide hole extends. The second support plate 82 has insertion holes 82*b*, 82*b* passing therethrough. The insertion holes 82*b*, 82*b* are formed at two of the four corners of the second support plate 82, which are located at both ends of one longer side thereof. The second support plate 82 is attached to the base member 83 by inserting screws 82*c*, 82*c* through the insertion holes 82*b*, 82*b*, and tightening the screws 82*c*, 82*c* into the tapped holes 83*a*, 83*a* of the base member 83. When the second support plate 82 is attached to the base member 83, the guide hole of the guide member provided at the opening 82*a* and the guide groove 86*a* of the opposing guide portion 86 of the first support plate 81 are aligned in a line.

Thus, the support body 8 supports the holder 5 of the ultrasonic actuator 2 by the guide holes 88*a* of the guide members 88 provided in the openings 84*a*, 82*a* of the first and second support plates 81, 82, and supports the roller shaft 62 of the ultrasonic actuator 2 by the guide grooves 85*a*, 86*a* of the first support plate 81. The first and second support plates 81, 82 form a guide portion, the guide holes 88*a* form a long hole, the guide grooves 85*a*, 86*a* form a groove, and the holder 5 and the roller shaft 62 form an engaging portion.

The guide holes 88*a*, which are configured to fit the holder 5 therein, and the guide grooves 85*a*, 86*a*, which are configured to fit the roller shaft 62 therein, are aligned in a line as viewed in the thickness direction of the actuator main body 4. Thus, the contact portion between the roller 6 and the movable body 11 is located at an intermediate position between the contact portions of the two driver elements 3, 3 and the movable body 11, in the axial direction of the shaft 10. That is, the pressing force for sandwiching the movable body 11 between the roller 6 and the actuator main body 4 is applied symmetrically with respect to the line passing through the contact portion of the roller 6 and the movable body 11 and extending in the direction in which the movable body 11 is sandwiched between the roller 6 and the actuator main body 4 (that is, the lateral direction of the actuator main body 4).

The operation of the drive unit 1 thus configured is controlled by the control unit. Specifically, the control unit receives an operation command from the outside, and applies AC voltages, having a frequency and a phase difference according to the operation command, to the first and second external electrodes 46, 47. Thus, the control unit harmonically generates stretching vibration and bending vibration in the actuator main body 4, thereby causing the driver elements 3, 3 to move in an orbital path as shown in FIGS. 8A-8D. At this time, the driver elements 3, 3 have been biased toward the movable body 11 by the coupling member 7, and a sufficient frictional force has been applied between the driver elements 3, 3 and the movable body 11. As a result, the movable body 11 is driven along the shaft 10 via the frictional force. Note that the roller 6 is in contact with the second slide plate 14 of the movable body 11 with a frictional force approximately equal to that of the driver elements 3, 3. However, since the roller main body 61 rotates via the ball bearing, the roller 6 does not hinder the movement of the movable body 11.

Note that the control unit applies to the first and second external electrodes 46, 47 AC voltages having a frequency slightly higher than the common resonant frequency of stretching vibration and bending vibration of the actuator main body 4 in order to reduce abnormal heat generation of the actuator main body 4. The AC voltages that are applied to the first and second external electrodes 46, 47 have a phase difference of 90° therebetween.

Driving of the movable body 11 will be described in more detail below. When the driver elements 3, 3 move in a substantially elliptical path, the frictional force between the driver elements 3, 3 and the first slide plate 13 of the movable body 11 increases and decreases periodically and repeatedly. At this time, the driving force in the longitudinal direction of the actuator main body 4 is transmitted to the movable body 11 via the frictional force, and the movable body 11 moves along the shaft 10. The longitudinal direction of the actuator main body 4 (which is the same as the direction in which the shaft 10 extends) corresponds to the driving direction that is the direction in which the driver elements 3, 3 output the driving force. Note that a reaction force in the direction opposite to that of the driving force in the longitudinal direction is applied from the movable body 11 to the actuator main body 4. However, since the holder 5 attached to the actuator main body 4 is engaged with the guide holes 88*a*, the reaction force is received by the first and second support plates 81, 82, which enables the actuator main body 4 to properly output the driving force to the movable body 11.

Figure 9A:
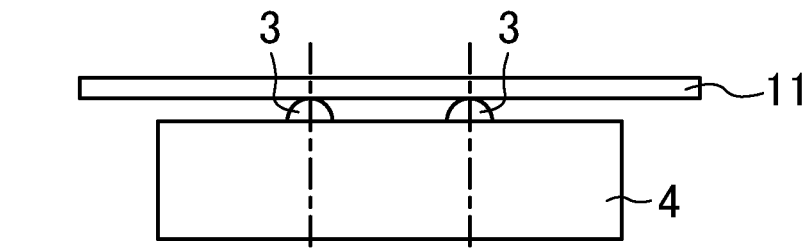
FIG. 9A is a conceptual diagram illustrating driving of a stage by an ultrasonic actuator, and showing the state before driving.
Figure 9B:
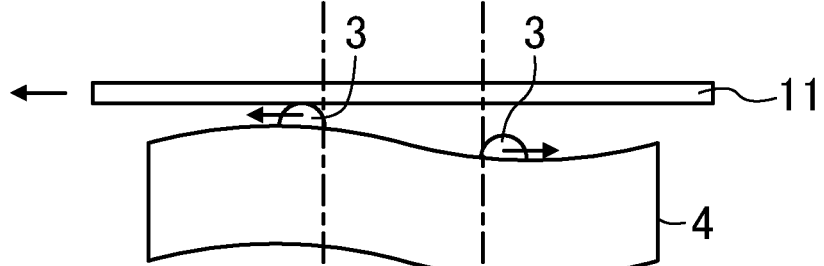
FIG. 9B is a conceptual diagram illustrating driving of the stage by the ultrasonic actuator, and showing the state where the actuator main body stretches in the longitudinal direction, and the stage is driven by one of driver elements.

More specifically, as shown in FIG. 9B, when the actuator main body 4 stretches in the longitudinal direction (the vibration direction of stretching vibration), one of the driver elements 3, 3 (e.g., the one located on the left side in FIGS. 9A-9C) is displaced while increasing the frictional force with the movable body 11 to a value larger than that before driving (i.e., the frictional force generated when the ultrasonic actuator 2 is merely installed). This increased frictional force moves the movable body 11 to the side (the left side in FIGS. 9A-9C) to which the one driver element 3 is displaced in the longitudinal direction. At this time, the other driver element 3 (located on the right side in FIGS. 9A-9C) is displaced in the direction opposite to that of the one driver element 3 in the longitudinal direction. However, the other driver element 3 is displaced in the state where it is separated from the movable body 11, or is displaced while reducing the frictional force with the movable body 11 to a value smaller than that before driving. Thus, the other driver element 3 hardly affects the movement of the movable body 11.

Figure 9C:
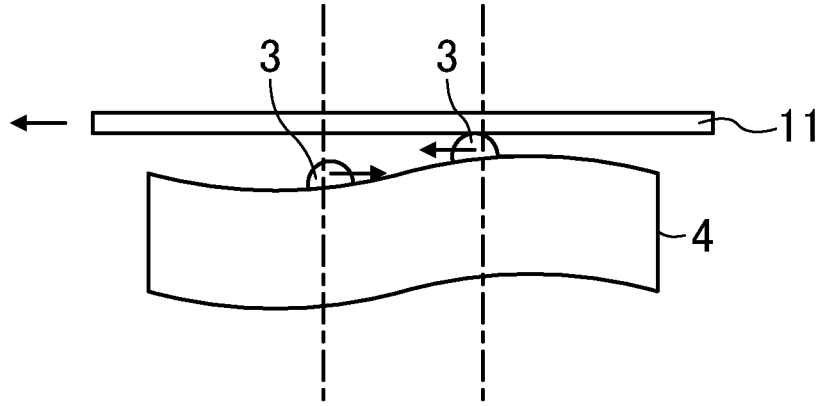
FIG. 9C is a conceptual diagram illustrating driving of the stage by the ultrasonic actuator, and showing the state where the actuator main body contracts in the longitudinal direction, and the stage is driven by the other driver element.

On the other hand, as shown in FIG. 9C, when the actuator main body 4 contracts in the longitudinal direction, the other driver element 3 (located on the right side in FIGS. 9A-9C) is displaced while increasing the frictional force with the movable body 11 to a value larger than that before driving (that is, the frictional force generated when the ultrasonic actuator 2 is merely installed). This increased frictional force moves the movable body 11 to the side (the left side in FIGS. 9A-9C) to which the other driver element 3 is displaced in the longitudinal direction. The direction in which the movable body 11 is moved is the same as that in which the movable body 11 is moved by the one driver element 3 when the actuator main body 4 stretches as described above. At this time, the one driver element 3 (located on the left side in FIGS. 9A-9C) is displaced in the direction opposite to that of the other driver element 3 in the longitudinal direction. However, the one driver element 3 is displaced in the state where it is separated from the movable body 11, or is displaced while reducing the frictional force with the movable body 11 to a value smaller than that before driving. Thus, the one driver element 3 hardly affects the movement of the movable body 11.

Note that in FIGS. 9A-9C, the driver element 3 that does not affect the movement of the movable body 11 is separated from the movable body 11. However, this driver element 3 need not necessarily be separated from the movable body 11. That is, this driver element 3 may be in contact with the movable body 11 with a frictional force that is not large enough to move the movable body 11.

Thus, the one driver element 3 and the other driver element 3 alternately move the movable body 11 in one predetermined direction with a phase difference of 180° therebetween. Note that applying the AC voltages having a phase difference of −90° therebetween to the first and second electrodes 46, 47 can reverse the direction of the driving force that is output from the driver elements 3, 3, and thus can move the movable body 11 in another direction.

Assembly of the drive unit 1 will be described below.

First, the pressing plate 74 is attached to the coupling member main body 70 by the screws 76, 76. The roller shaft 62 of the roller 6 is fitted into the guide grooves 85a, 86a of the first support plate 81. Since the width of the guide grooves 85a, 86a is slightly greater than the outer diameter of the roller shaft 62, the roller shaft 62 is capable of moving freely in the direction in which the guide grooves 85a, 86a extend. Then, the first support plate 81 is fixed to the base member 83 by the screws 84c, 84c. The coupling member main body 70 and the first support plate 81 are fixed to a jig so as to have the positional relationship of the finished assembly. At this time, the protrusions 74c, 74c of the pressing plate 74 are fitted into the guide grooves 85a, 86a of the first support plate 81, and the pressing plate 74 is fixed to the coupling member main body 70 by the screws 76, 76.

Then, one end portion of the holder 5 fixed to the actuator main body 4 is inserted through the guide hole 88a of the first support plate 81. At this time, the actuator main body 4 is positioned so that the driver elements 3, 3 face the roller 6. The plate spring 75 is positioned on the side of the actuator main body 4 having the holder 5 thereon. Thereafter, the other end portion of the holder 5 is inserted through the guide hole of the second support plate 82, and the second support plate 82 is fixed to the base member 83 via the screws 82c, 82c.

Subsequently, the movable body 11 is positioned between the actuator main body 4 and the roller 6 so that the second slide plate 14 faces the driver elements 3, 3. Then, the plate spring 75 is attached to the coupling member main body 70 via the stepped screws 77 having the coiled springs 78 fitted thereon. At this time, the coiled springs 78 are compressively deformed. The elastic force of the coiled springs 78 is transmitted to the actuator main body 4 via the plate spring 75. As a result, the actuator main body 4 is biased (pressed) toward the movable body 11. This elastic force of the coiled springs 78 does not only act on the actuator main body 4, but also acts as a reaction force on the coupling member main body 70. The reaction force of the coiled springs 78 biases (presses) the roller 6 toward the movable body 11 via the coupling member main body 70. Thus, with the movable body 11 being sandwiched between the actuator main body 4 and the roller 6, the movable body 11 is pressed in the sandwiching direction (i.e., the direction in which the actuator main body 4 and the roller 6 move toward each other). This configuration can ensure a sufficient frictional force between the actuator main body 4 and the movable body 11, whereby the driving force of the actuator main body 4 can be efficiently transmitted to the movable body 11. Note that the biasing forces of the actuator main body 4 and the roller 6, namely the frictional force between the actuator main body 4 and the movable body 11, can be adjusted by the amount of compression of the coiled springs 78.

The ultrasonic actuator 2 thus configured is supported by the support body 8 so as to be displaceable in the direction in which the actuator main body 4 and the roller 6 are biased toward the movable body 11 (i.e., the direction in which the movable body 11 is sandwiched between the actuator main body 4 and the roller 6, the Y-axis direction in the figure). Specifically, the holder 5 attached to the actuator main body 4 is movable in the guide holes 88a in the biasing direction, and the roller shaft 62 of the roller 6 is movable in the guide grooves 85a, 86a in the biasing direction. Thus, even if the positions of the ultrasonic actuator 2 and the movable body 11 are shifted relative to each other in the biasing direction due to shape errors and attachment errors of the shaft 10, the movable body 11, the ultrasonic actuator 2, and the support body 8, the ultrasonic actuator 2 is displaced in the biasing direction, whereby the shift in position can be absorbed. As a result, the position of the ultrasonic actuator 2 in the biasing direction is automatically adjusted to balance the pressing force that is applied from the actuator main body 4 to the movable body 11 with the pressing force that is applied from the roller 6 to the movable body 11. Thus, the actuator main body 4 can be pressed against the movable body 11 without applying any unwanted force to the shaft 10, whereby the driving force of the actuator main body 4 can be efficiently transmitted to the movable body 11.

Moreover, the holder 5 is fitted in the guide holes 88a of the first and second support plates 81, 82 so as to be displaceable in the direction perpendicular to both the axial direction of the shaft 10 and the biasing direction of the coupling member 7 (that is, in the thickness direction of the actuator main body 4, the Z-axis direction in the figure; hereinafter referred to as the "perpendicular direction"). The roller shaft 62 is fitted in the guide grooves 85a, 86a of the first support plate 81 so as to be displaceable in the perpendicular direction. That is, the ultrasonic actuator 2 is supported by the support body 8 so as to be displaceable in the perpendicular direction. Thus, even if the positions of the ultrasonic actuator 2 and the movable body 11 are shifted relative to each other in the perpendicular direction due to shape errors and attachment errors, the ultrasonic actuator 2 is displaced in the perpendicular direction with respect to the support body 8, whereby the shift in position can be absorbed. As a result, the actuator main body 4 can be pressed against the movable body 11 without applying any unwanted force to the shaft 10, whereby the driving force of the actuator main body 4 can be efficiently transmitted to the movable body 11.

The actuator main body 4 and the roller 6 sandwich the movable body 11 therebetween in the biasing direction, but are displaceable with respect to the movable body 11 in a plane that is perpendicular to the biasing direction. Thus, the shift in position of the ultrasonic actuator 2 and the movable body 11 in the perpendicular direction can also be absorbed by displacement of the actuator main body 4 and the roller 6 in the perpendicular direction in the plane perpendicular to the biasing direction.

Note that the movable body 11 is movable in the axial direction of the shaft 10. Thus, even if the positions of the ultrasonic actuator 2 and the movable body 11 are shifted relative to each other in the axial direction due to shape errors and attachment errors, the shift in position in the axial direction can be absorbed by movement of the movable body 11 along the shaft 10.

Since the guide holes 88a for fitting the holder 5 therein and the guide grooves 85a, 86a for fitting the roller shaft 62 therein are in the shape of a long hole extending in the biasing direction, the ultrasonic actuator 2 is rotatable about the axis of the shaft 10. Thus, even if the positions of the ultrasonic actuator 2 and the movable body 11 are shifted relative to each other in the rotation direction about the axis of the shaft 10 due to shape errors and attachment errors, the ultrasonic actuator 2 rotates about the axis with respect to the support body 8, whereby the shift in position can be absorbed.

Moreover, although the guide holes 88a restrict the displacement of the holder 5 in the axial direction of the shaft 10, a gap large enough to allow the holder 5 to be displaced along the guide hole 88a is provided between each guide hole 88a and the holder 5. Similarly, although the guide grooves 85a, 86a restrict the displacement of the roller shaft 62 in the axial direction of the shaft 10, a gap large enough to allow the roller shaft 62 to be displaced along the guide groove 85a, 86a is provided between each guide groove 85a, 86a and the roller shaft 62. Thus, even with the holder 5 being fitted in the guide holes 88a, and with the roller shaft 62 being fitted in the guide grooves 85a, 86a, the ultrasonic actuator 2 is rotatable about the axis along the perpendicular direction. Accordingly, even if the positions of the ultrasonic actuator 2 and the movable body 11 are shifted relative to each other in the rotation direction about the axis due to shape errors and attachment errors, the ultrasonic actuator 2 rotates about the axis with respect to the support body 8, whereby the shift in position can be absorbed.

As described above, the actuator main body 4 and the roller 6 sandwich the movable body 11 therebetween in the biasing direction, but are displaceable with respect to the movable body 11 in the plane perpendicular to the biasing direction. Thus, even if the positions of the ultrasonic actuator 2 and the movable body 11 are shifted relative to each other in the rotation direction about the axis extending in the biasing direction due to shape errors and attachment errors, the ultrasonic actuator 2 rotates about the axis with respect to the movable body 11, whereby the shift in position can be absorbed.

Figure 10:
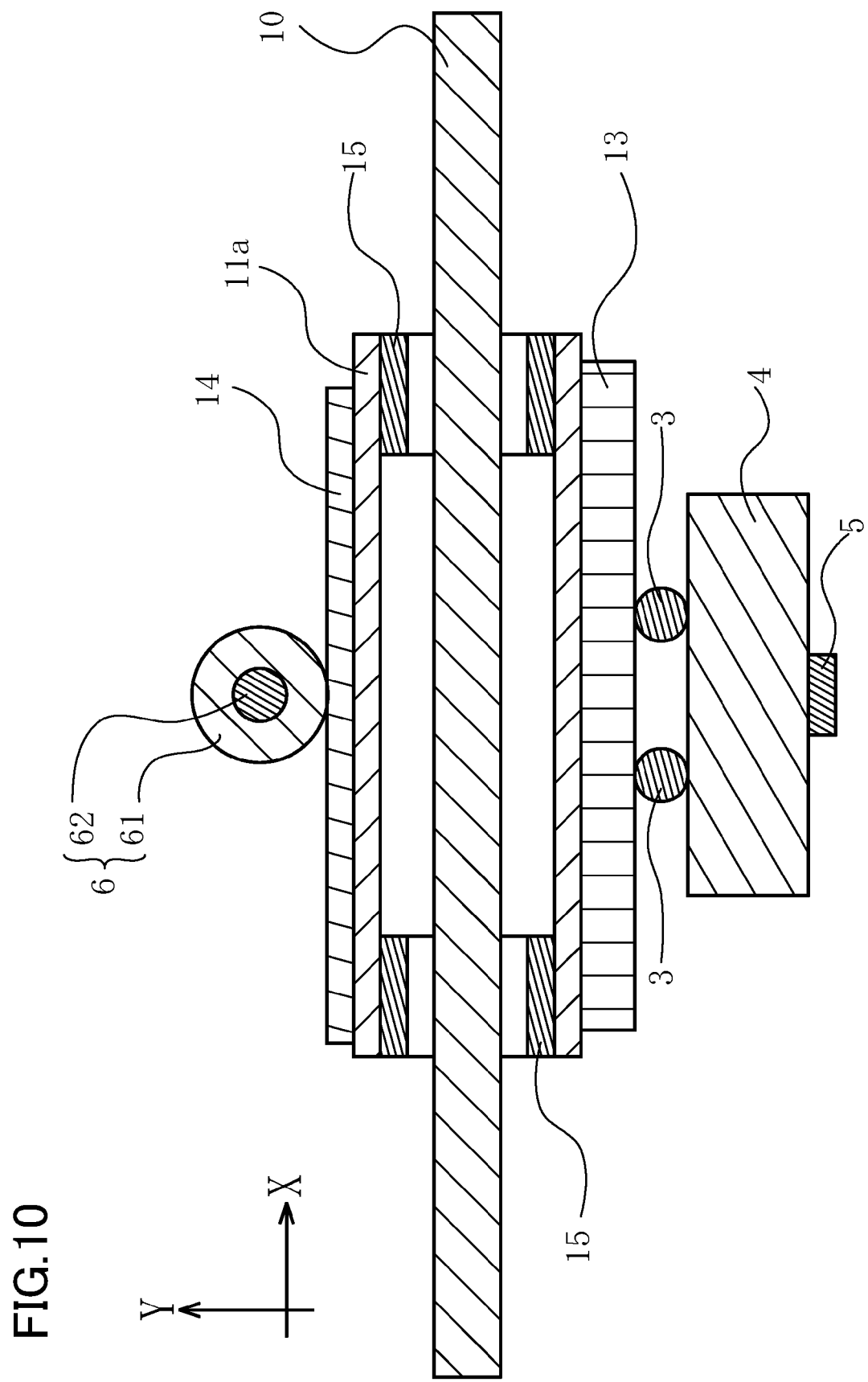
FIG. 10 is a cross-sectional view showing major members of the drive unit in a case where an opposing member is positioned in a middle portion of a movable body, and a biasing force is not applied to the opposing member.
Figure 11:
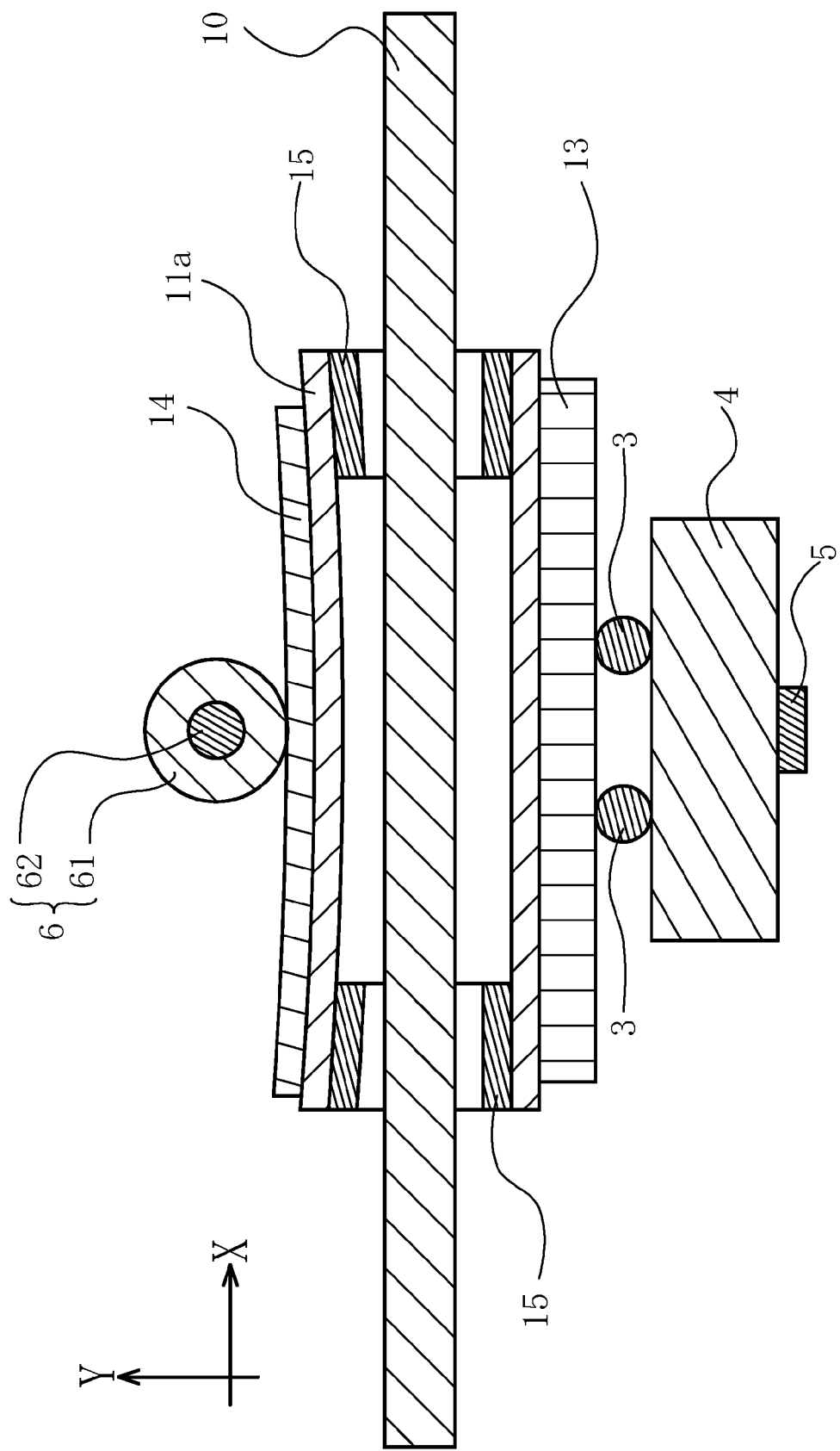
FIG. 11 is a cross-sectional view showing major members of the drive unit in a case where an opposing member is positioned in a middle portion of a movable body, and a biasing force is applied to the opposing member.
Figure 12:
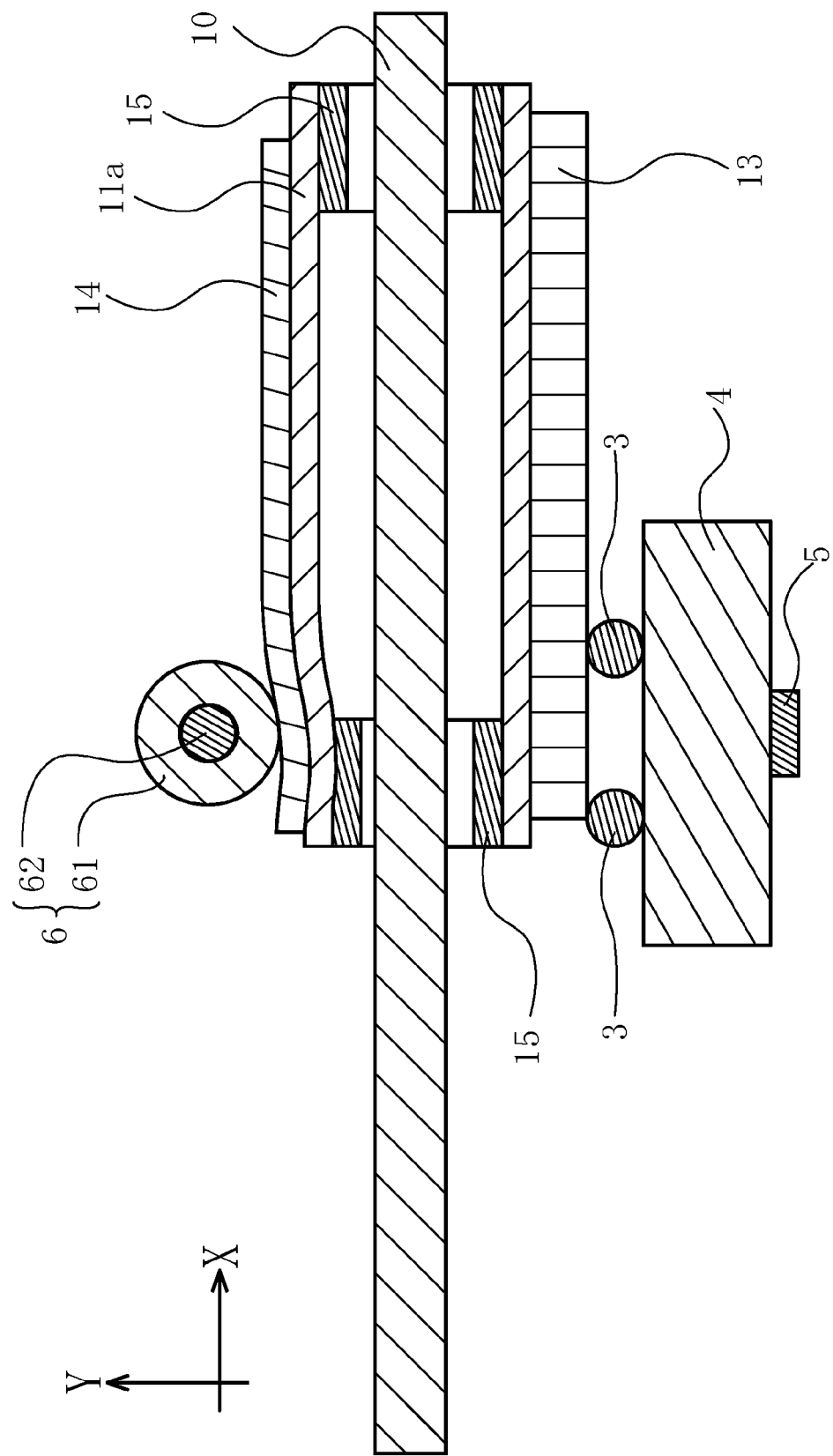
FIG. 12 is a cross-sectional view showing major members of the drive unit configured so that a second slide plate has an elastic modulus equal to that of an opposing member, in a case where the opposing member is positioned in an end portion of a movable body, and a biasing force is applied to the opposing member.
Figure 13:
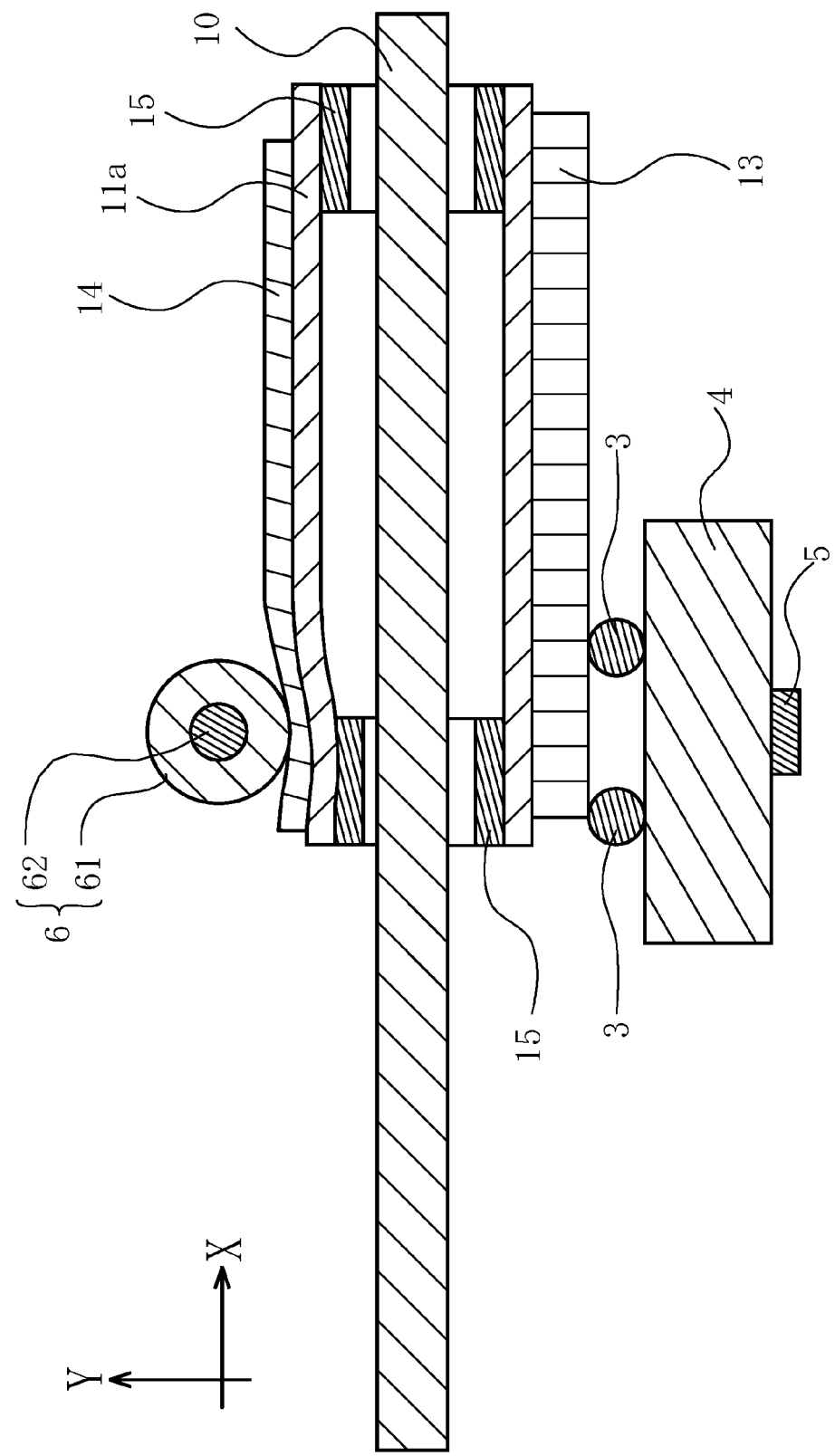
FIG. 13 is a cross-sectional view showing major members of the drive unit configured so that a second slide plate has an elastic modulus lower than that of an opposing member, in a case where the opposing member is positioned in an end portion of a movable body, and a biasing force is applied to the opposing member.
Figure 14:
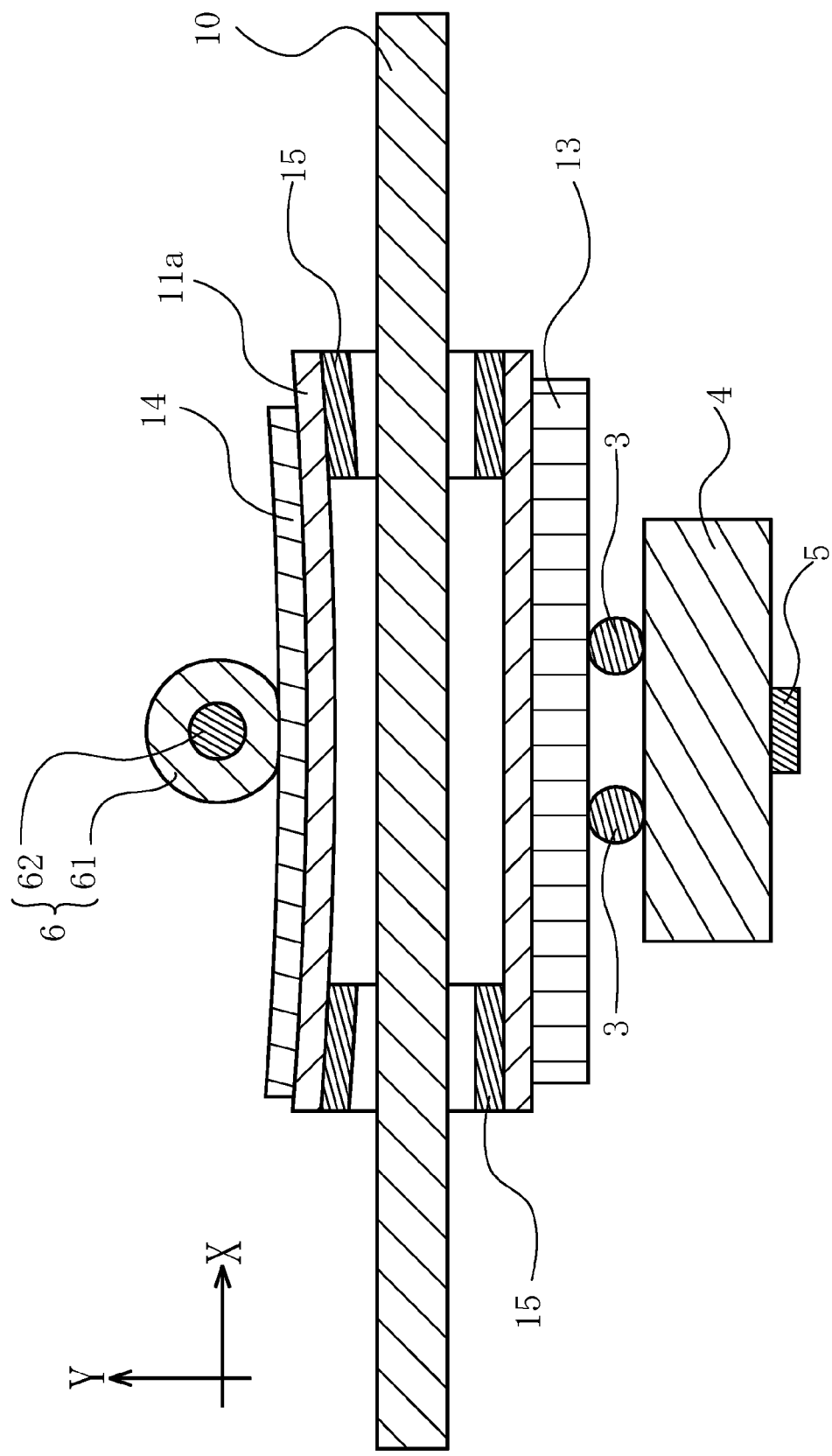
FIG. 14 is a cross-sectional view showing major members of the drive unit configured so that an opposing member has an elastic modulus lower than that of a second slide plate, in a case where the opposing member is positioned in a middle portion of a movable body, and a biasing force is applied to the opposing member.

Next, deformation of the movable body 11 caused by pressing the movable body 11 by the actuator main body 4 and the roller 6 will be described below. FIGS. 10-14 are cross-sectional views of primary members of the drive unit including the movable body 11. FIG. 10 illustrates a state where the roller 6 is positioned in the middle portion of the movable body 11 and the biasing force is not applied to the roller 6. FIG. 11 illustrates a state where the roller 6 is positioned in the middle portion of the movable body 11 and the biasing force is applied to the roller 6. FIG. 12 illustrates a state where in a configuration in which the second slide plate 14 has an elastic modulus equal to that of the roller 6, the roller 6 is positioned in the end portion of the movable body 11 and the biasing force is applied to the roller 6. FIG. 13 illustrates a state where in a configuration in which the second slide plate 14 has an elastic modulus lower than that of the roller 6, the roller 6 is positioned in the end portion of the movable body 11, and the biasing force is applied to the roller 6. FIG. 14 illustrates a state where in a configuration in which the roller 6 has a lower elastic modulus than that of the second slide plate 14, the roller 6 is positioned in the center of the movable body 11, and the biasing force is applied to the roller 6. The middle portion and the end portion of the movable body 11 herein mean the middle portion and end portion of the movable body 11 in the moving direction, unless specifically described. Also, the middle portion is not the exact center, but is a part other than the end portion. Note that the center of the movable body 11 corresponds to the center of the stroke of movement of the movable body 11.

When the movable body 11 is pressed by the actuator main body 4 and the roller 6, a portion (which will be hereinafter referred to as a contact portion) of the movable body 11, which contacts the roller 6, is deformed, and potions of the movable body 11, which contact the driver elements 3, 3, are hardly deformed. Specifically, the first slide plate 13 and the main body 11a are hardly deformed, because the first slide plate 13 having a high rigidity is provided in the portions of the movable body 11, which contact the driver elements 3, 3. Accordingly, a good contact state is achieved between the actuator main body 4 and the movable body 11, a friction force between the driver elements 3, 3 and the first slide plate 13 can be sufficiently ensured, and a driving force of the actuator main body 4 can be efficiently transmitted to the movable body 11.

In contrast, the second slide plate 14 provided in the portion of the movable body 11, which is contacted by the roller 6, is deformed because the second slide plate 14 has a low rigidity, and more specifically, has a lower rigidity than that of the roller 6. As a result, the main body 11a is deformed, too. The second slide plate 14 is deformed symmetrically about the contact portion contacted by the roller 6 in the moving direction (the X direction in FIG. 11) in this case. That is, the portion of the second slide plate 14, which is contacted by the roller 6, is substantially parallel to the X direction. Therefore, the pressing force from the roller 6 acts on the second slide plate 14 in the direction (the Y direction) of the pressing force itself, i.e., the biasing direction of the biasing force by the coupling member 7. A component of the moving direction is not generated from the pressing force. In this case, the roller main body 61 is hardly deformed, while the second slide plate 14 is deformed, and thus, a force which hinders rotation of the roller 6 is not generated. As a result, the roller main body 61 can be smoothly rotated, and the drive unit 1 can exhibit a desired performance.

Next, deformation of the movable body 11 when the driver elements 3, 3 and the roller 6 contact the end portion of the movable body 11 will be described herein.

First, a case where the second slide plate 14 has an elastic modulus equal to that of the roller 6 will be described. For example, a case where the second slide plate 14 is made of stainless alloy will be described. As shown in FIG. 12, the pressing force from the driver elements 3, 3 is distributed between the two driver elements 3, 3, and the distributed forces act on the first slide plate 13. Therefore, deformation of the first slide plate 13 and the main body 11a is small. In contrast, the number of the roller 6 is one, and therefore, the pressing force from the roller 6 intensively acts on the portion of the second slide plate 14, which is contacted by the roller 6. As a result, the second slide plate 14 is deformed so that the contact portion is recessed. The second slide plate 14 is deformed not to be thinned but to be entirely curved, because the elastic modulus of second slide plate 14 is equal to that of the roller 6, and is higher than that of the main body 11a of the movable body 11. As a result, the second slide plate 14 and the main body 11a are deformed together to be entirely curved. In this case, a portion of the second slide plate 14 located closer to the center thereof than the contact portion at a small distance from the contact portion is hardly deformed. Since a portion of the second slide plate 14 between the contact portion and the portion which is hardly deformed is continuous, and therefore, a recess amount reduces as the distance from the contact portion increases. As a result, the second slide plate 14 is tilted so that the recess amount gradually increases in the direction from the portion which is hardly deformed to the contact portion. On the other hand, in a portion of the second slide plate 14 located closer to an end thereof than the contact portion, only a small portion of the movable body 11 is located, as compared to the contact portion. That is, in the portion closer to the end than the contact portion, only a small portion restricts deformation of the movable body 11. Therefore, the recess amount reduces and the portion gradually returns to the original shape as the distance from the contact portion increases, but the rate at which the portion returns to the original shape is lower, as compared to the portion closer to the center than the contact portion. Specifically, even when the distance from the contact portion is the same, the amount of deformation is larger in the portion closer to the end than that in the portion closer to the center. Thus, in the second slide plate 14, a tilt in the portion located closer to the center than the contact portion is relatively steep, and a tilt in the portion closer to the end than the contact portion is relatively moderate. That is, the portion of the second slide plate 14, which is contacted by the roller 6, is not parallel to the moving direction but is tilted down so that the portion closer to the end is recessed more the portion closer to the center.

As a result, a component of a force which is applied to move the movable body 11 in the X direction is generated from the pressing force of the roller 6. Specifically, a force, i.e., an ejection force, which acts to eject the movable body 11 from between the actuator main body 4 and the roller 6 is applied to the movable body 11 in the X direction. The ejection force acts on the movable body 11 inwardly from the end portion in the moving direction at all the time, regardless of the moving direction of the movable body 11.

Specifically, when the second slide plate 14 has a high elastic modulus, the portion of the second slide plate 14 located closer to the end thereof is affected by deformation of the contact portion to be deformed accordingly, and a tilt of the second slide plate 14 might be steep in the contact portion. This means that the ejection force is increased.

Subsequently, a case where the second slide plate 14 has an elastic modulus lower than that of the roller 6 will be described. For example, a case where the second slide plate 14 is made of a plastic material, and the roller main body 61 is made of stainless alloy will be described. As shown in FIG. 13, when deformation of the movable body 11 is viewed macroscopically, the amount of deformation in a portion closer to the end than the contact portion is larger than the amount of deformation in a portion closer to the center. Since the second slide plate 14 has an elastic modulus lower than that of the roller 6, the thickness of the second slide plate 14 is easily changed. Accordingly, the second slide plate 14 is deformed so that the thickness of the contact portion is locally reduced, as compared to the case of FIG. 12. Therefore, a tilt of the portion of the second slide plate 14, which is contacted by the roller 6, is moderate, as compared to the case of FIG. 12, or is substantially parallel to the moving direction. As a result, the ejection force is reduced. In this case, the roller main body 61 is hardly deformed while the second slide plate 14 is deformed, and thus, a force which hinders rotation of the roller 6 is not generated. As a result, the roller main body 61 can be smoothly rotated, and the drive unit 1 can exhibit a desired performance.

Therefore, according to this embodiment, the second slide plate 14 which contacts with the roller main body 61 is caused to be easily deformed, thus allowing the second slide plate 14 to be deformed symmetrically about the roller main body 61 in the moving direction. Thus, the tilt of the portion of the second slide plate 14, which is contacted by the roller main body 61, can be reduced, and the ejection force which acts on the movable body 11 can be reduced. Because of this, even in the end portion of the movable body 11, the driving of the movable body 11 can be kept smooth. As a result, the stroke of movement with which the movable body 11 can be correctly operated can be expanded.

Since the roller main body 61 has an elastic modulus higher than that of the second slide plate 14, deformation of the roller main body 61 itself can be reduced. Thus, the rotation of the roller main body 61 can be kept smooth. If the roller main body 61 has an elastic modulus lower than that of the second slide plate 14 as shown in FIG. 14, a portion of the roller main body 61, which contacts the second slide plate 14, is deformed to be flat. When the roller main body 61 is deformed in the above-described manner, resistance power to the rotation of the roller main body 61 is generated, and thus, the smooth rotation of the roller main body 61 is hindered. In contrast, according to this embodiment, the second slide plate 14 is deformed, and the roller main body 61 is hardly deformed, so that the roller main body 61 can be smoothly rotated.

Other Embodiments

The above embodiment may be configured as described below.

For example, the shape of the main body 11a of the movable body 11 is not limited to that described in the above embodiment, and the main body 11a may have any shape.

Furthermore, although the bearing portions 15 are provided only at the ends of the through hole 11b of the main body 11a of the movable body 11 in the present embodiment, the bearing portion 15 may be provided along the entire length of the through hole 11b.

One or both of the first and second slide plates 13, 14 may be omitted. However, when the second slide plate 14 is omitted, a portion of the movable body 11, which contacts the roller 6, is made of a material having an elastic modulus lower than that of the roller 6.

The materials of the main body 11a of the movable body 11 and the bearing portions 15 are not limited to those described in the above embodiment, and any materials may be used. However, it is preferable that the elastic modulus of the bearing portions 15 is higher than that of the main body 11a. The materials of the first and second slide plates 13, 14 are not limited to those described in the above embodiment. Although any material can be used for the first slide plate 13, it is preferable to use a material having an elastic modulus higher than that of the main body 11a of the movable body 11. Also, any material can be used of the second slide plate 14. Specifically, a material having an elastic modulus lower than that of the roller 6, more specifically, the roller main body 61 may be used, and a material having an elastic modulus lower than that of the main body 11a of the movable body 11 is preferably used.

In the above embodiment, the roller 6 is provided as an opposing member. However, the opposing member is not limited to the roller 6. For example, the opposing member may be a roller having a roller main body non-rotatably attached to a roller shaft. The opposing member may be a contact member that merely contacts the movable body 11. In this case, the contact member may be provided either separately from or integrally with the coupling member 7. Note that it is preferable that the contact member have low frictional resistance with respect to the movable body 11. The opposing member may be another actuator main body. In this case, the movable body 11 is held between the two actuator main bodies. That is, the movable body 11 is driven by the two actuator main bodies. Any member may be used as the opposing member as long as it contacts the movable body 11 and is positioned so as to face the actuator main body 4 with the movable body 11 interposed therebetween.

In the above embodiment, the elastic modulus of the second slide plate 14 is made lower than that of the roller 6. A similar configuration may be employed in the relationship of the first slide plate 13 and the actuator main body 4. That is, the elastic modulus of the first slide plate 13 (i.e., a portion thereof contacted by the actuator body) may be made lower than that of the driver elements 3, 3.

A coupling structure for coupling the actuator main body 4 with the opposing member (the roller 6 in the present embodiment) is not limited to the configuration using the coupling member 7. Any configuration may be employed as long as it couples the actuator main body 4 with the opposing member, and biases the actuator main body 4 and the opposing member so that the movable body 11 is sandwiched therebetween.

Furthermore, the coupling member 7 can be omitted. Any configuration may be employed as long as it biases the actuator main body 4 and the roller 6 toward the movable body 11 to cause the actuator main body 4 and the roller 6 to contact the movable body 11.

The support structure for supporting the ultrasonic actuator 2 by the support body 8 is not limited to the above configuration. For example, although the holder 5 is supported by the guide members 88 of the first and second support plates 81, 82, the guide members 88 are not necessarily required. That is, the holder 5 may be directly supported by the first and second support plates 81, 82 via the openings 84a, 82a formed therein. Alternatively, protrusions may be provided in the coupling member 7, and the protrusions may be supported by the guide holes 88a or the guide grooves 85a, 86a of the support body 8. Guide holes or guide grooves extending in the biasing direction may be formed in the coupling member 7 and the actuator main body 4, and engaging portions configured to engage with the guide holes or the guide grooves may be provided in the support body 8. That is, any configuration may be used as long as the ultrasonic actuator 2 can be supported so as to be displaceable in the biasing direction.

The above embodiment is described with respect to the configuration in which the ultrasonic actuator 2 drives the columnar movable body 11. However, the present embodiment can be used in configurations for driving various objects. For example, the present embodiment may be configured to drive a lens frame of a camera by the ultrasonic actuator 2. In this case, the movable body 11 is provided integrally with the lens frame, and the lens frame is configured to be movable along the shaft 10. The present embodiment may be configured to drive such a lens frame by the ultrasonic actuator 2.

Furthermore, in the above embodiment, the actuator main body 4 is fixed, and the movable body 11 moves. However, the present invention is not limited to this. Any configuration may be employed as long as the actuator main body 4 and the movable body 11 move relative to each other. For example, a configuration in which the movable body 11 is fixed, and the actuator main body 4 moves may be employed.

Although the ultrasonic actuator 2 generates the first-order mode of stretching vibration and the second-order mode of bending vibration in the actuator main body 4, the present invention is not limited to this. An actuator main body that generates any mode of vibration can be used as long as it generates stretching vibration and bending vibration in the actuator main body 4.

Although two driver elements 3, 3 are provided on the longer side face 40c of the actuator main body 4, the present invention is not limited to this. For example, the driver elements may be provided on the shorter side face 40e of the actuator main body 4. In this case, the actuator main body 4 contacts the movable body 11 so that the shorter side face 40e of the actuator main body 4 faces the movable body 11. The actuator main body 4 outputs a driving force in the direction of bending vibration.

As described above, the technique disclosed herein is useful for drive units configured to drive a movable body using a vibratory actuator.

The present invention is not limited to the above embodiments, and may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes and modifications which come within the meaning and range of equivalency of the claims are to be embraced within their scope.

What is claimed is:

1. A drive unit, comprising:
   an actuator main body configured to vibrate to output a driving force;
   a movable body which is contacted by the actuator main body and is movable relative to the actuator main body in a predetermined moving direction; and
   an opposing member positioned to face the actuator main body with the movable body interposed therebetween and configured to sandwich the movable body together with the actuator main body so that the movable body is kept movable, wherein a portion of the movable body, which contacts the opposing member, has an elastic modulus lower than that of the opposing member, the movable body includes a movable main body, and a sliding member which is provided in the movable main body and contacts the actuator main body, and the sliding member has an elastic modulus higher than that of the movable main body.

2. The drive unit of claim 1, further comprising:

a coupling member configured to couple the actuator main body with the opposing member, and biases the actuator main body and the opposing member so that the actuator main body and the opposing member press the movable body.

3. The drive unit of claim 1, further comprising:

a shaft configured to support the movable body so that the movable body is movable in the moving direction.

4. The drive unit of claim 2, further comprising:

a support portion configured to support the actuator main body so that the actuator main body is displaceable in a direction of biasing of the coupling member.

\* \* \* \* \*